United States Patent
Venkatesan et al.

(10) Patent No.: US 10,452,308 B2
(45) Date of Patent: Oct. 22, 2019

(54) ENCODING TAGS FOR METADATA ENTRIES IN A STORAGE SYSTEM

(71) Applicant: Robin Systems, Inc., San Jose, CA (US)

(72) Inventors: Dhanashankar Venkatesan, San Jose, CA (US); Jagadish K. Mukku, Sunnyvale, CA (US); Ripulkumar Hemantbhai Patel, Fremont, CA (US)

(73) Assignee: ROBIN SYSTEMS, INC., San Jose, CA (US)

( * ) Notice: Subject to any disclaimer, the term of this patent is extended or adjusted under 35 U.S.C. 154(b) by 0 days.

(21) Appl. No.: 15/847,739

(22) Filed: Dec. 19, 2017

(65) Prior Publication Data
US 2019/0187908 A1  Jun. 20, 2019

(51) Int. Cl.
| | |
|---|---|
| G06F 13/00 | (2006.01) |
| G06F 3/06 | (2006.01) |
| G06F 12/02 | (2006.01) |
| G06F 11/14 | (2006.01) |
| G06F 11/10 | (2006.01) |
| H03M 7/30 | (2006.01) |

(52) U.S. Cl.
CPC ............ *G06F 3/065* (2013.01); *G06F 3/0605* (2013.01); *G06F 3/067* (2013.01); *G06F 3/0614* (2013.01); *G06F 11/1044* (2013.01); *G06F 11/1435* (2013.01); *G06F 11/1464* (2013.01); *G06F 12/0246* (2013.01); *G06F 12/0253* (2013.01); *H03M 7/30* (2013.01)

(58) Field of Classification Search
CPC .................................................. G06F 11/1435
See application file for complete search history.

(56) References Cited

U.S. PATENT DOCUMENTS

| | | |
|---|---|---|
| 4,310,883 A | 1/1982 | Clifton |
| 6,014,669 A | 1/2000 | Slaughter |

(Continued)

FOREIGN PATENT DOCUMENTS

WO  WO2017008675  1/2017

OTHER PUBLICATIONS

Segment map.

(Continued)

*Primary Examiner* — Sean D Rossiter
(74) *Attorney, Agent, or Firm* — David R. Stevens; Stevens Law Group

(57) ABSTRACT

A new snapshot of a storage volume is created by instructing computing nodes to suppress write requests. Once pending write requests from the computing nodes are completed, storage nodes create a new snapshot for the storage volume by allocating a new segment to the new snapshot and finalizes and performs garbage collection with respect to segments allocated to the previous snapshot. The snapshots may be represented by a storage manager in a hierarchy. Deleted snapshots may be flagged as such in the hierarchy and deletion may be implemented only in memory on a storage node, which is then restored from the hierarchy in the event of a crash. A snapshot is removed from the hierarchy when all segments previously are freed by garbage collection. A hybrid storage node may perform both computing and storage services. Data may be written with tags indicating encoding protocols used to encode the data.

18 Claims, 15 Drawing Sheets

(56) References Cited

U.S. PATENT DOCUMENTS

| | | | |
|---|---|---|---|
| 6,119,214 | A | 9/2000 | Dirks |
| 6,161,191 | A | 12/2000 | Slaughter |
| 6,311,193 | B1 | 10/2001 | Sekido |
| 6,851,034 | B2 | 2/2005 | Challenger |
| 6,895,485 | B1 | 5/2005 | Dekoning |
| 6,957,221 | B1 | 10/2005 | Hart |
| 7,590,620 | B1 | 9/2009 | Pike |
| 7,738,457 | B2 | 6/2010 | Nordmark |
| 7,779,091 | B2 | 8/2010 | Wilkinson |
| 8,171,141 | B1 | 5/2012 | Offer |
| 8,505,003 | B2 | 8/2013 | Bowen |
| 8,527,544 | B1 | 9/2013 | Colgrove |
| 8,601,467 | B2 | 12/2013 | Hofhansl |
| 8,620,973 | B1 | 12/2013 | Veeraswamy |
| 8,745,003 | B1 | 6/2014 | Patterson |
| 8,782,632 | B1 | 7/2014 | Chigurapati |
| 8,788,634 | B2 | 7/2014 | Krig |
| 8,832,324 | B1 | 9/2014 | Hodges |
| 8,886,806 | B2 | 11/2014 | Tung |
| 8,909,885 | B2 | 12/2014 | Corbett |
| 8,966,198 | B1 | 2/2015 | Harris |
| 9,134,992 | B2 | 9/2015 | Wong |
| 9,148,465 | B2 | 9/2015 | Gambardella |
| 9,167,028 | B1 | 10/2015 | Bansal |
| 9,280,591 | B1 | 3/2016 | Kharatishvili |
| 9,330,155 | B1 | 5/2016 | Bono |
| 9,342,444 | B2 | 5/2016 | Minckler |
| 9,367,301 | B1 | 6/2016 | Serrano |
| 9,436,693 | B1 | 9/2016 | Lockhart |
| 9,521,198 | B1 | 12/2016 | Agarwala |
| 9,619,389 | B1* | 4/2017 | Roug .................. G06F 12/0835 |
| 9,635,132 | B1 | 4/2017 | Lin |
| 9,747,096 | B2 | 8/2017 | Searlee |
| 9,870,366 | B1 | 1/2018 | Duan |
| 10,019,459 | B1 | 7/2018 | Agarwala |
| 10,042,628 | B2 | 8/2018 | Thompson |
| 10,061,520 | B1 | 8/2018 | Zhao |
| 10,191,778 | B1 | 1/2019 | Yang |
| 10,282,229 | B2 | 5/2019 | Wagner |
| 2005/0065986 | A1 | 3/2005 | Bixby |
| 2005/0216895 | A1 | 9/2005 | Tran |
| 2007/0067583 | A1 | 3/2007 | Zohar |
| 2007/0260842 | A1 | 11/2007 | Faibish |
| 2008/0189468 | A1 | 8/2008 | Schmidt |
| 2008/0270592 | A1 | 10/2008 | Choudhary |
| 2009/0307249 | A1* | 12/2009 | Koifman .................. G06F 3/0623 |
| 2010/0161941 | A1 | 6/2010 | Vyshetsky |
| 2010/0211815 | A1 | 8/2010 | Mankovskii |
| 2010/0306495 | A1 | 12/2010 | Kumano |
| 2010/0332730 | A1 | 12/2010 | Royer |
| 2011/0083126 | A1 | 4/2011 | Bhakta |
| 2011/0188506 | A1 | 8/2011 | Arribas |
| 2012/0066449 | A1 | 3/2012 | Colgrove |
| 2012/0102369 | A1 | 4/2012 | Hiltunen |
| 2012/0226667 | A1 | 9/2012 | Volvovski |
| 2012/0240012 | A1 | 9/2012 | Weathers |
| 2012/0331113 | A1 | 12/2012 | Jain |
| 2013/0339659 | A1 | 12/2013 | Bybell |
| 2013/0346709 | A1 | 12/2013 | Wang |
| 2014/0006465 | A1 | 1/2014 | Davis |
| 2014/0047341 | A1 | 2/2014 | Breternitz |
| 2014/0058871 | A1 | 2/2014 | Marr |
| 2015/0046644 | A1 | 2/2015 | Karp |
| 2015/0067031 | A1 | 3/2015 | Acharya |
| 2015/0074358 | A1 | 3/2015 | Flinsbaugh |
| 2015/0134857 | A1 | 5/2015 | Hahn |
| 2015/0186217 | A1 | 7/2015 | Eslami |
| 2015/0326481 | A1 | 11/2015 | Rector |
| 2016/0042005 | A1 | 2/2016 | Liu |
| 2016/0124775 | A1 | 5/2016 | Ashtiani |
| 2016/0197995 | A1 | 7/2016 | Lu |
| 2016/0259597 | A1* | 9/2016 | Worley .................. G06F 3/0688 |
| 2016/0283261 | A1 | 9/2016 | Nakatsu |
| 2016/0357456 | A1 | 12/2016 | Iwasaki |
| 2016/0357548 | A1 | 12/2016 | Stanton |
| 2017/0244787 | A1 | 8/2017 | Rangasamy |
| 2017/0337492 | A1 | 11/2017 | Chen |
| 2017/0371551 | A1* | 12/2017 | Sachdev .................. G06F 3/065 |
| 2018/0046553 | A1 | 2/2018 | Okamoto |
| 2018/0107419 | A1* | 4/2018 | Sachdev .................. G06F 3/065 |
| 2018/0113770 | A1 | 4/2018 | Hasanov |
| 2018/0218000 | A1 | 8/2018 | Setty |
| 2018/0246745 | A1 | 8/2018 | Aronovich |
| 2018/0247064 | A1 | 8/2018 | Aronovich |
| 2018/0285353 | A1 | 10/2018 | Ramohalli |
| 2018/0329981 | A1 | 11/2018 | Gupte |
| 2018/0364917 | A1* | 12/2018 | Ki .................. G06F 3/0608 |
| 2019/0065061 | A1* | 2/2019 | Kim .................. G06F 3/0604 |
| 2019/0073132 | A1* | 3/2019 | Zhou .................. G06F 3/0608 |
| 2019/0079928 | A1* | 3/2019 | Kumar .................. G06F 11/1448 |
| 2019/0190803 | A1 | 6/2019 | Joshi |

OTHER PUBLICATIONS

Fast and Secure Append-Only storage with Infinite Capacity, Zheng.

User Mode and Kernel Mode, Microsoft.

Implementing time critical functionalities with a distributed adaptive container architecture, Stankovski.

Precise memory leak detection for java software using container profiling, Xu.

\* cited by examiner

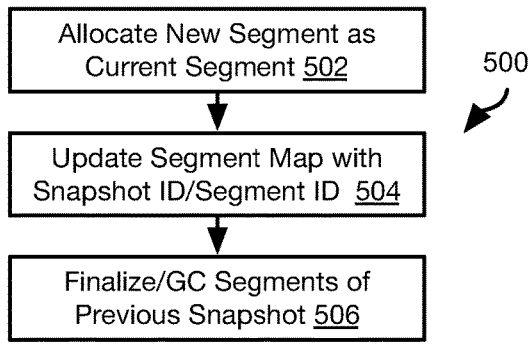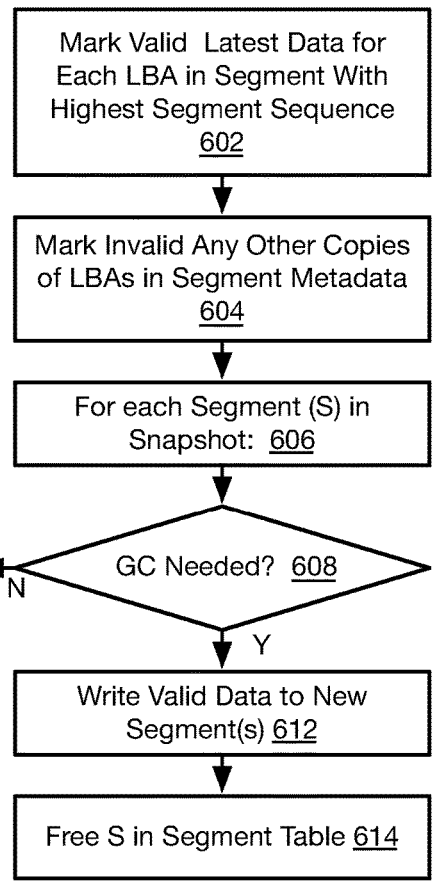
Fig. 5
Fig. 6

ENCODING TAGS FOR METADATA ENTRIES IN A STORAGE SYSTEM

RELATED APPLICATIONS

This application is related to U.S. application Ser. No. 15/847,652 filed Dec. 19, 2017 and U.S. application Ser. No. 15/847,693 filed Dec. 19, 2017, which are incorporated herein by reference for all purposes.

BACKGROUND

Field of the Invention

This invention relates to creating snapshots of a storage volume.

Background of the Invention

In many contexts, it is helpful to be able to return a database to an original state or some intermediate state. In this manner, changes to software or other database configuration parameters may be tested without fear of corrupting critical data.

The systems and methods disclosed herein provide an improved approach for creating snapshots of a database and returning to a previous snapshot.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which:

FIG. 5 is a process flow diagram of a method for processing a snapshot instruction by a storage node in accordance with an embodiment of the present invention;

FIG. 6 is a process flow diagram of a method for performing garbage collection on segments in accordance with an embodiment of the present invention;

DETAILED DESCRIPTION

Figure 1:
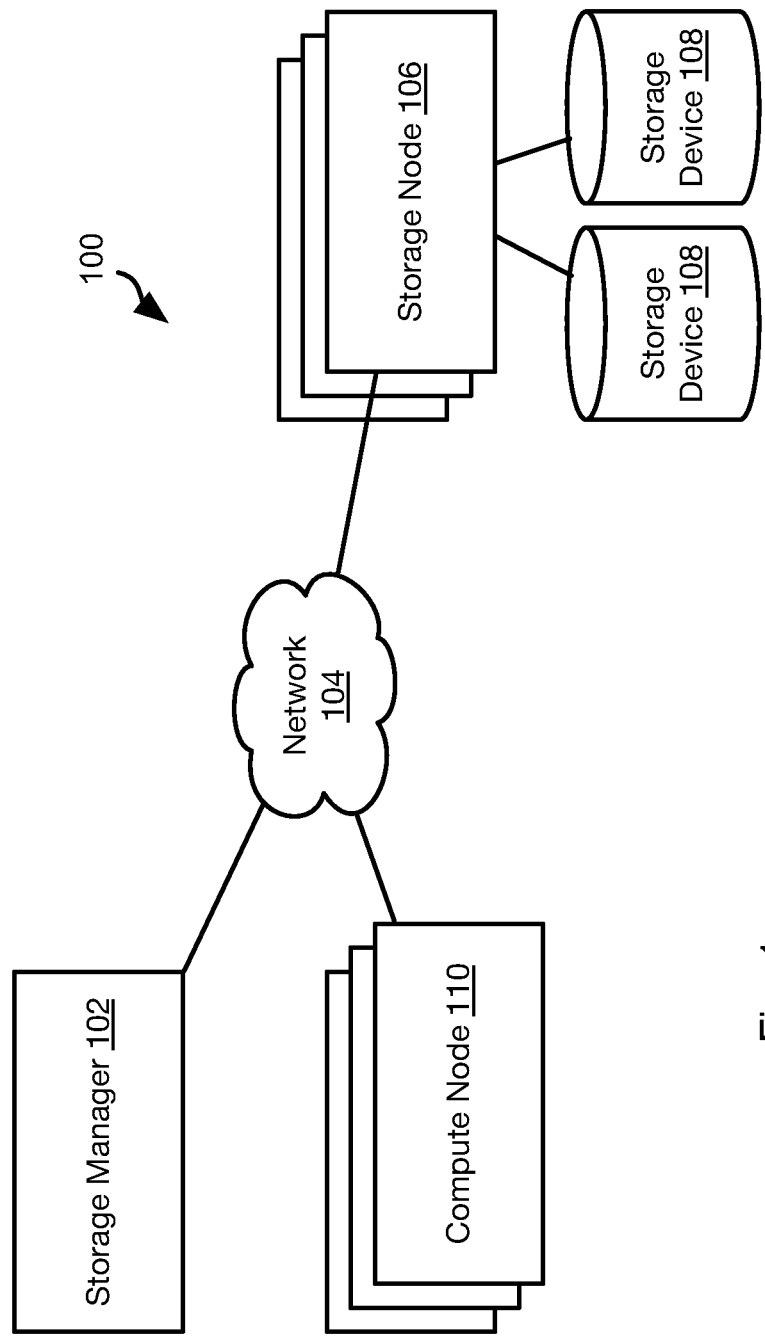
FIG. 1 is a schematic block diagram of a network environment for implementing methods in accordance with an embodiment of the present invention.

Referring to FIG. 1, the methods disclosed herein may be performed using the illustrated network environment 100. The network environment 100 includes a storage manager 102 that coordinates the creation of snapshots of storage volumes and maintains records of where snapshots are stored within the network environment 100. In particular, the storage manager 102 may be connected by way of a network 104 to one or more storage nodes 106, each storage node having one or more storage devices 108, e.g. hard disk drives, flash memory, or other persistent or transitory memory. The network 104 may be a local area network (LAN), wide area network (WAN), or any other type of network including wired, fireless, fiber optic, or any other type of network connections.

One or more compute nodes 110 are also coupled to the network 104 and host user applications that generate read and write requests with respect to storage volumes managed by the storage manager 102 and stored within the memory devices 108 of the storage nodes 108.

The methods disclosed herein ascribe certain functions to the storage manager 102, storage nodes 106, and compute node 110. The methods disclosed herein are particularly useful for large scale deployment including large amounts of data distributed over many storage nodes 106 and accessed by many compute nodes 110. However, the methods disclosed herein may also be implemented using a single computer implementing the functions ascribed herein to some or all of the storage manager 102, storage nodes 106, and compute node 110.

Figure 2:
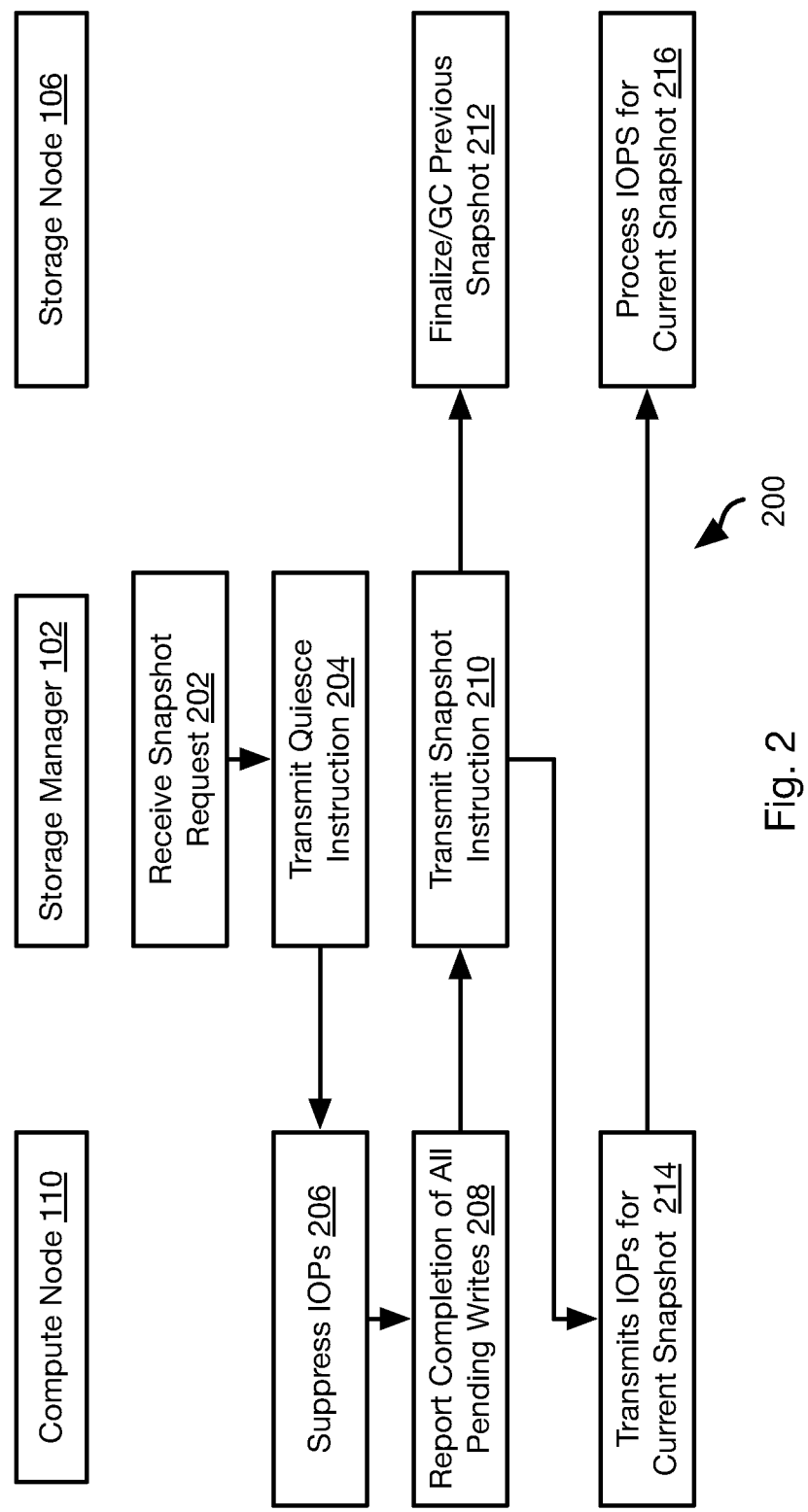
FIG. 2 is a process flow diagram of a method for coordinating snapshot creation with compute nodes and storage nodes in accordance with an embodiment of the present invention.

Referring to FIG. 2, the illustrated method 200 may be performed in order to invoke the creation of a new snapshot. Other than a current snapshot, which is still subject to change, a snapshot captures the state of a storage volume at a moment in time and is preferably not altered in response to subsequent writes to the storage volume.

The method 200 includes receiving, by the storage manager 102 a request to create a new snapshot for a storage volume. A storage volume as referred to herein may be a virtual storage volume that may divided into individual slices. For example, storage volumes as described herein may be 1 TB and be divided into 1 GB slices. In general, a slice and its snapshot are stored on a single storage node 106, whereas a storage volume may have the slices thereof stored by multiple storage nodes 106.

The request received at step 202 may be received from a human operator or generated automatically, such as according to backup scheduler executing on the storage manager 102 or some other computing device. The subsequent steps of the method 200 may be executed in response to receiving 202 the request The method 200 may include transmitting 204 a quiesce instruction to all compute nodes 110 that are associated with the storage volume. For example, all compute nodes 110 that have pending write requests to the storage volume. In some embodiments, the storage manager 102 may store a mapping of compute nodes 110 to a particular storage volume used by the compute nodes 110. Accordingly, step 204 may include sending 204 the quiesce instruction to all of these compute nodes. Alternatively, the instruction may be transmitted 204 to all compute nodes 110 and include an identifier of the storage volume. The compute nodes 110 may then suppress any write instructions referencing that storage volume.

The quiesce instruction instructs the compute nodes 110 that receive it to suppress 206 transmitting write requests to the storage nodes 106 for the storage volume referenced by the quiesce instruction. The quiesce instruction may further cause the compute nodes 110 that receive it to report 208 to the storage manager 102 when no write requests are pending for that storage volume, i.e. all write requests issued to one or more storage nodes 106 and referencing slices of that storage volume have been acknowledged by the one or more storage nodes 106.

In response to receiving the report of step 208 from one or more compute nodes, e.g. all compute nodes that are mapped to the storage node that is the subject of the snapshot request of step 202, the storage manager 102 transmits 210 an instruction to the storage nodes 106 associated with the storage volume to create a new snapshot of that storage volume. Step 210 may further include transmitting 210 an instruction to the compute nodes 110 associated with the storage volume to commence issuing write commands to the storage nodes 106 associated with the storage volume. In some embodiments, the instruction of step 110 may include an identifier of the new snapshot. Accordingly, subsequent input/output operations (IOPs) transmitted 214 from the compute nodes may reference that snapshot identifier. Likewise, the storage node 106 may associate the snapshot identifier with data subsequently written to the storage volume, as described in greater detail below.

In response to receiving 210 the instruction to create a new snapshot, each storage node 106 finalizes 212 segments associated with the current snapshot, which may include performing garbage collection, as described in greater detail below. In addition, subsequent IOPs received by the storage node may also be processed 216 using the new snapshot as the current snapshot, as is also described in greater detail below.

Figure 3:
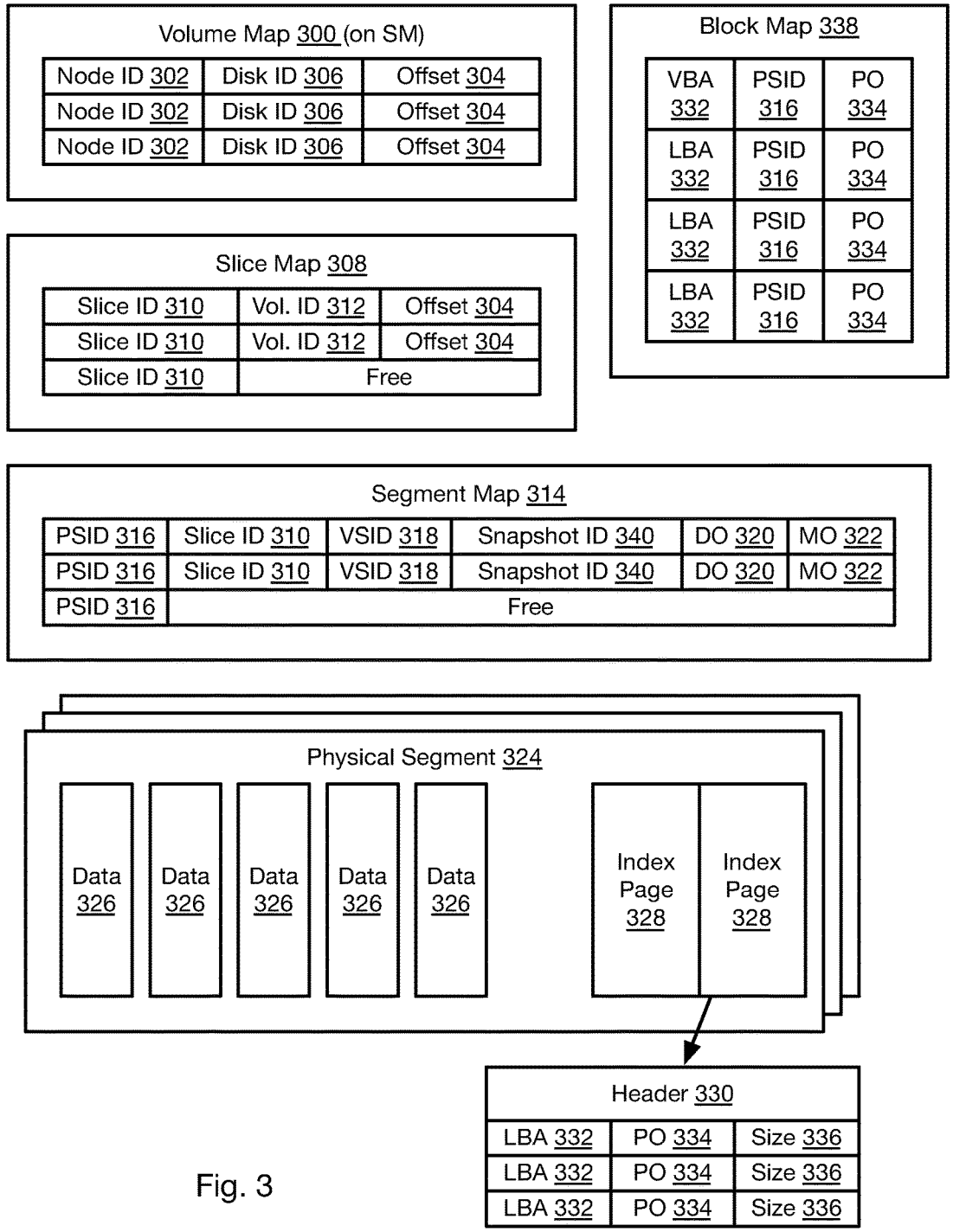
FIG. 3 is a schematic diagram illustrating the storage of data within a storage node in accordance with an embodiment of the present invention.

Referring to FIG. 3, the method by which slices are allocated, reassigned, written to, and read from may be understood with respect to the illustrated data storage scheme. The data of the storage scheme may be stored in transitory or persistent memory of the storage node 106, such as in the storage devices 108.

For each logical volume, the storage manager 102 may store and maintain a volume map 300. For each slice in the logical volume, the volume map may include an entry including a node identifier 302 identifying the storage node 106 to which the slice is assigned and an offset 304 within the logical volume at which the slice begins. In some embodiments, slices are assigned both to a storage node 106 and a specific storage device hosted by the storage node 106. Accordingly, the entry may further include a disk identifier of the storage node 106 referencing the specific storage device to which the slice is assigned.

The remaining data structures of FIG. 3 are stored on each storage node 106. The storage node 106 may store a slice map 308. The slice map 308 may include entries including a local slice identifier 310 that uniquely identifies each slice of the storage node 106, e.g. each slice of each storage device hosted by the storage node 106. The entry may further include a volume identifier 312 that identifies the logical volume to which the local slice identifier 310 is assigned. The entry may further include the offset 304 within the logical volume of the slice of the logical volume assigned to the storage node 106.

In some embodiments, an entry in the slice map 308 is created for a slice of the logical volume only after a write request is received that references the offset 304 for that slice. This further supports the implementation of overprovisioning such that slices may be assigned to a storage node 106 in excess of its actual capacity since the slice is only tied up in the slice map 308 when it is actually used.

The storage node 106 may further store and maintain a segment map 314. The segment map 314 includes entries either including or corresponding to a particular physical segment identifier (PSID) 316. For example, the segment map 314 may be in an area of memory such that each address in that area corresponds to one PSID 316 such that the entry does not actually need to include the PSID 316. The entries of the segment map 314 may further include a slice identifier 310 that identifies a local slice of the storage node 106 to which the PSID 316 has been assigned. The entry may further include a virtual segment identifier (VSID) 318. As described in greater detail below, each time a segment is assigned to logical volume and a slice of a logical volume, it may be assigned a VSID 318 such that the VSIDs 318 increase in value monotonically in order of assignment. In this manner, the most recent PSID 316 assigned to a logical volume and slice of a logical volume may easily be determined by the magnitude of the VSIDs 318 mapped to the PSIDs 316. In some embodiments, VSIDs 318 are assigned in a monotonically increasing series for all segments assigned to volume ID 312. In other embodiments, each offset 304 and its corresponding slice ID 310 is assigned VSIDs separately, such that each slice ID 310 has its own corresponding series of monotonically increasing VSIDs 318 assigned to segments allocated to that slice ID 310.

The entries of the segment map 314 may further include a data offset 320 for the PSID 316 of that entry. As described in greater detail below, when data is written to a segment it may be written at a first open position from a first end of the segment. Accordingly, the data offset 320 may indicate the location of this first open position in the segment. The data offset 320 for a segment may therefore be updated each time data is written to the segment to indicate where the new first open position is.

The entries of the segment map 314 may further include a metadata offset 322. As described in detail below, for each write request written to a segment, a metadata entry may be stored in that segment at a first open position from a second end of the segment opposite the first end. Accordingly, the metadata offset 322 in an entry of the segment map 314 may indicate a location of this first open position of the segment corresponding to the entry.

Each PSID 316 corresponds to a physical segment 324 on a device hosted by the storage node 106. As shown, data payloads 326 from various write requests are written to the physical segment 324 starting from a first end (left) of the physical segment. The physical segment may further store index pages 328 such that index pages are written starting from a second end (right) of the physical segment 324.

Each index page 328 may include a header 330. The header 330 may be coded data that enables identification of a start of an index page 328. The entries of the index page 328 each correspond to one of the data payloads 326 and are written in the same order as the data payloads 326. Each entry may include a logical block address (LBA) 332. The LBA 332 indicates an offset within the logical volume to which the data payload corresponds. The LBA 332 may indicate an offset within a slice of the logical volume. For example, inasmuch as the PSID 316 is mapped to a slice ID 310 that is mapped to an offset 304 within a particular volume ID 312, maps 308 and 314, and an LBA 332 within the slice may be mapped to the corresponding offset 304 to obtain a fully resolved address within the logical volume.

In some embodiments, the entries of the index page 328 may further include a physical offset 334 of the data payload 326 corresponding to that entry. Alternatively, or additionally, the entries of the index page 328 may include a size 336 of the data payload 326 corresponding to the entry. In this manner, the offset to the start of a data payload 326 for an entry may be obtained by adding up the sizes 336 of previously written entries in the index pages 328.

The metadata offset 322 may point to the last index page 328 (furthest from right in illustrated example) and may further point to the first open entry in the last index page 328. In this manner, for each write request, the metadata entry for that request may be written to the first open position in the last index page 328. If all of the index pages 328 are full, a new index page 328 may be created and stored at the first open position from the second end and the metadata for the write request may be added at the first open position in that index page 328.

The storage node 106 may further store and maintain a block map 338. A block map 338 may be maintained for each logical volume and/or for each slice offset of each logical volume, e.g. for each local slice ID 310 which is mapped to a slice offset and logical volume by slice map 308. The entries of the block map 338 map include entries corresponding to each LBA 332 within the logical volume or slice of the logical volume. The entries may include the LBA 332 itself or may be stored at a location within the block map corresponding to an LBA 332.

The entry for each LBA 332 may include the PSID 316 identifying the physical segment 324 to which a write request referencing that LBA was last written. In some embodiments, the entry for each LBA 332 may further indicate the physical offset 334 within that physical segment 324 to which the data for that LBA was written. Alternatively, the physical offset 324 may be obtained from the index pages 328 of that physical segment. As data is written to an LBA 332, the entry for that LBA 332 may be overwritten to indicate the physical segment 324 and physical offset 334 within that segment 324 to which the most recent data was written.

In embodiments implementing multiple snapshots for a volume and slice of a volume, the segment map 314 may additionally include a snapshot ID 340 identifying the snapshot to which the PSID 316 has been assigned. In particular, each time a segment is allocated to a volume and slice of a volume, the current snapshot identifier for that volume and slice of a volume will be included as the snapshot ID 340 for that PSID 316.

In response to an instruction to create a new snapshot for a volume and slice of a volume, the storage node 106 will store the new current snapshot identifier, e.g. increment the previously stored current snapshot ID 340, and subsequently allocated segments will include the current snapshot ID 340. PSIDs 316 that are not filled and are allocated to the previous snapshot ID 340 may no longer be written to. Instead, they may be finalized or subject to garbage collection (see FIGS. 5 and 6).

Figure 4:
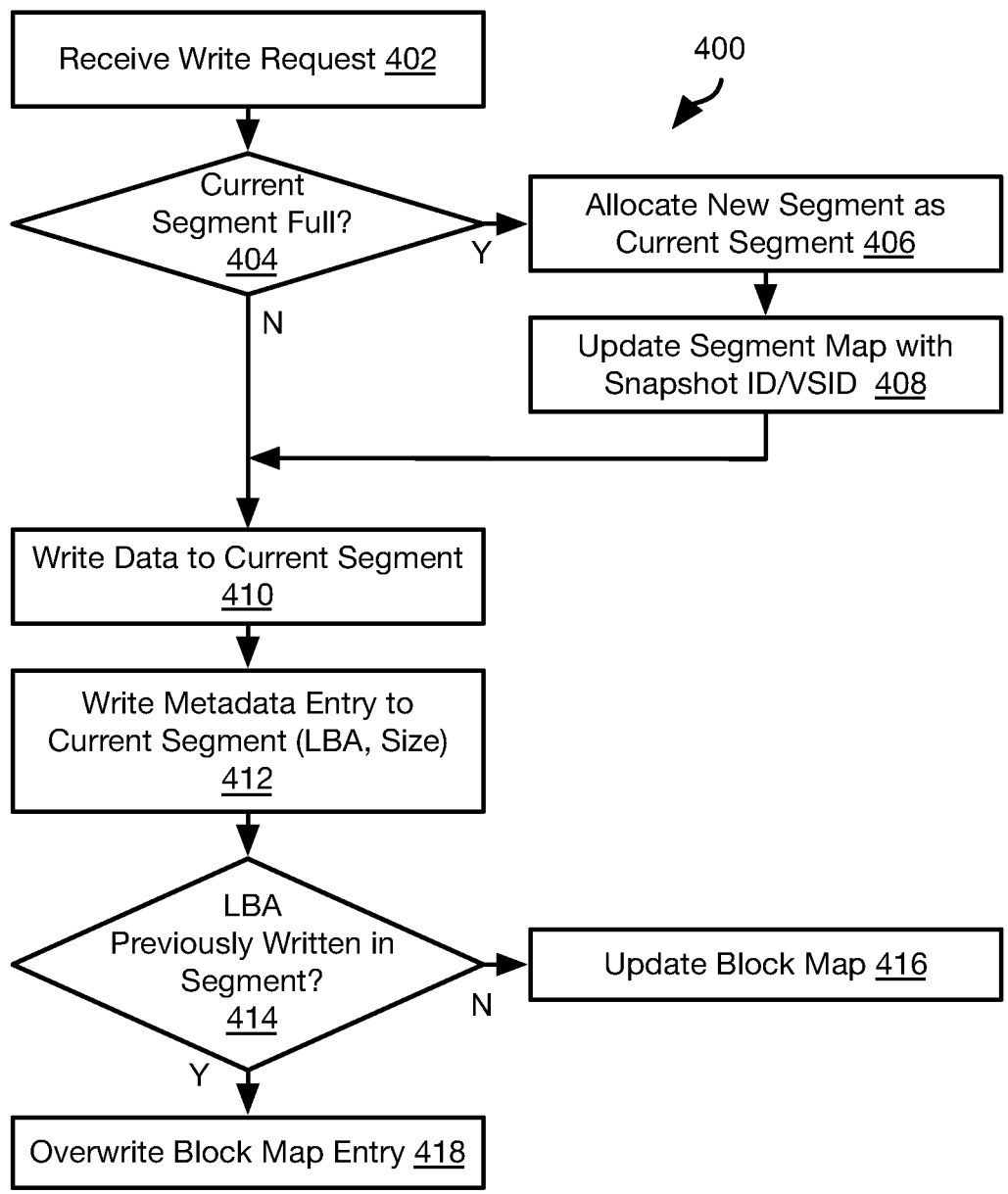
FIG. 4 is a process flow diagram of a method for processing write requests in a storage node in accordance with an embodiment of the present invention.

FIG. 4 illustrates a method 400 for executing write instructions by a storage node 106, such as write instructions received from an application executing on a compute node 110.

The method 400 includes receiving 402 a write request. The write request may include payload data, payload data size, and an LBA as well as fields such as a slice identifier, a volume identifier, and a snapshot identifier. Where a slice identifier is included, the LBA may be an offset within the slice, otherwise the LBA may be an address within the storage volume.

The method 400 may include evaluating 404 whether a PSID 316 is allocated to the snapshot referenced in the write request and whether the physical segment 324 corresponding to the PSID 316 ("the current segment") has space for the payload data. In some embodiments, as write requests are performed with respect to a PSID 316, the amount of data written as data 326 and index pages 328 may be tracked, such as by way of the data offset 320 and metadata offset 322 pointers. Accordingly, if the amount of previously-written data 326 and the number of allocated index pages 328 plus the size of the payload data and its corresponding metadata entry exceeds the capacity of the current segment it may be determined to be full at step 404.

If the current segment is determined 404 to be full, the method 400 may include allocating 406 a new PSID 316 as the current PSID 316 and its corresponding physical segment 324 as the current segment for the snapshot referenced in the write request. In some embodiments, the status of PSIDs 316 of the physical storage devices 108 may be flagged in the segment map 314 as allocated or free as a result of allocation and garbage collection, which is discussed below. Accordingly, a free PSID 316 may be identified in the segment map 314 and flagged as allocated.

The segment map 314 may also be updated 408 to include a slice ID 310 and snapshot ID 340 mapping the current PSID 316 to the snapshot ID, volume ID 312, and offset 304 included in the write request. Upon allocation, the current PSID 316 may also be mapped to a VSID (virtual segment identifier) 318 that will be a number higher than previously VSIDs 318 such that the VSIDs increase monotonically, subject, of course, to the size limit of the field used to store the VSID 318. However, the size of the field may be sufficiently large that it is not limiting in most situations.

The method 400 may include writing 410 the payload data to the current segment. As described above, this may include writing 410 payload data 326 to the free location closest to the first end of the current segment.

The method 400 may further include writing 412 a metadata entry to the current segment. This may include writing the metadata entry (LBA, size) to the first free location closest to the second end of the current segment.

Alternatively, this may include writing the metadata entry to the first free location in an index page 328 that has room for it or creating a new index page 328 located adjacent a previous index page 328. Steps 410, 412 may include updating one or more pointers or table that indicates an amount of space available in the physical segment, such as a pointer 320 to the first free address closest to the first end and a pointer 322 to the first free address closest to the second end, which may be the first free address before the last index page 328 and/or the first free address in the last index page. In particular, these pointers may be maintained as the data offset 320 and metadata offset in the segment map 314 for the current PSID 316.

The method 400 may further include updating 416 the block map 338 for the current snapshot. In particular, for each LBA 332 referenced in the write request, an entry in the block map 338 for that LBA 332 may be updated to reference the current PSID 316. A write request may write to a range of LBAs 332. Accordingly, the entry for each LBA 332 in that range may be updated to refer to the current PSID 316.

Updating the block map 338 may include evaluating 414 whether an entry for a given LBA 332 referenced in the write request already exists in the block map 338. If so, then that entry is overwritten 418 to refer to the current PSID 316. If not, an entry is updated 416 in the block map 318 that maps the LBA 332 to the current PSID 316. In this manner, the block map 338 only references LBAs 332 that are actually written to, which may be less than all of the LBAs 332 of a storage volume or slice. In other embodiments, the block map 338 is of fixed size and includes and entry for each LBA 332 regardless of whether it has been written to previously. The block map 338 may also be updated to include the physical offset 334 within the current segment to which the data 326 from the write request was written.

In some embodiments, the storage node 106 may execute multiple write requests in parallel for the same LBA 332. Accordingly, it is possible that a later write can complete first and update the block map 338 whereas a previous write request to the same LBA 332 completes later. The data of the previous write request is therefore stale and the block map 338 should not be updated.

Suppressing of updating the block map 338 may be achieved by using the VSIDs 318 and physical offset 334. When executing a write request for an LBA, the VSID 318 mapped to the segment 324 and the physical offset 334 to which the data is to be, or was, written may be compared to the VSID 318 and offset 334 corresponding to the entry in the block map 338 for the LBA 332. If the VSID 318 mapped in the segment map 314 to the PSID 316 in the entry of the block map 338 corresponding to the LBA 332, then the block map 338 will not be updated. Likewise, if the VSID 318 corresponding to the PSID 316 in the block map 338 is the same as the VSID 318 for the write request and the physical offset 334 in the block map 338 is higher than the offset 334 to which the data of the write request is to be or was written, the block map 338 will not be updated for the write request.

As a result of steps 414-418, the block map 338 only lists the PSID 316 where the valid data for a given LBA 332 is stored. Accordingly, only the index pages 328 of the physical segment 324 mapped to the PSID 316 listed in the block map 338 need be searched to find the data for a given LBA 332. In instances where the physical offset 334 is stored in the block map 338, no searching is required.

FIG. 5 illustrates a method 500 executed by a storage node 106 in response to the new snapshot instruction of step 210 for a storage volume. The method 500 may be executed in response to an explicit instruction to create a new snapshot or in response to a write request that includes a new snapshot ID 340. The method 500 may also be executed with respect to a current snapshot that is still being addressed by new write requests. For example, the method 500 may be executed periodically or be triggered based on usage.

The method 500 may include allocating 502 a new PSID 316 and its corresponding physical segment 324 as the current PSID 316 and current segment for the storage volume, e.g., by including a slice ID 310 corresponding to a volume ID 312 and offset 304 included in the new snapshot instruction or the write request referencing the new snapshot ID 340. Allocating 502 a new segment may include updating 504 an entry in the segment map 314 that maps the current PSID 316 to the snapshot ID 340 and a slice ID 310 corresponding to a volume ID 312 and offset 304 included in the new snapshot instruction.

As noted above, when a PSID 316 is allocated, the VSID 318 for that PSID 316 may be a number higher than all VSIDs 318 previously assigned to that volume ID 312, and possibly to that slice ID 310 (where slices have separate series of VSIDs 318). The snapshot ID 340 of the new snapshot may be included in the new snapshot instruction or the storage node 106 may simply assign a new snapshot ID that is the previous snapshot ID 340 plus one.

The method 500 may further include finalizing 506 and performing garbage collection with respect to PSIDs 316 mapped to one or more previous snapshots IDs 340 for the volume ID 312 in the segment map 314, e.g., PSIDs 316 assigned to the snapshot ID 340 that was the current snapshot immediately before the new snapshot instruction was received.

FIG. 6 illustrates a method 600 for finalizing and performing garbage collection with respect to segment IDs 340 for a snapshot ("the subject snapshot"), which may include the current snapshot or a previous snapshot. The method 600 may include marking 602 as valid latest-written data for an LBA 332 in the PSID 316 having the highest VSID 318 in the segment map 314 and to which data was written for that LBA 332. Marking 602 data as valid may include making an entry in a separate table that lists the location of valid data or entries for metadata in a given physical segment 324 or setting a flag in the metadata entries stored in the index pages 328 of a physical segment 324, e.g., a flag that indicates that the data referenced by that metadata is invalid or valid.

Note that the block map 338 records the PSID 316 for the latest version of the data written to a given LBA 332. Accordingly, any references to that LBA 332 in the physical segment 324 of a PSID 316 mapped to a lower-numbered VSID 318 may be marked 604 as invalid. For the physical segment 324 of the PSID 316 in the block map 338 for a given LBA 332, the last metadata entry for that LBA 332 may be found and marked as valid, i.e. the last entry referencing the LBA 332 in the index page 328 that is the last index page 328 including a reference to the LBA 332. Any other references to the LBA 332 in the physical segment 324 may be marked 604 as invalid. Note that the physical offset 334 for the LBA 332 may be included in the block map 334, so all metadata entries not corresponding to that physical offset 334 may be marked as invalid.

The method 600 may then include processing 606 each segment ID S of the PSIDs 316 mapped to the subject snapshot according to steps 608-620. In some embodiments, the processing of step 606 may exclude a current PSID 316, i.e. the last PSID 302 assigned to the subject snapshot. As described below, garbage collection may include writing valid data from a segment to a new segment. Accordingly, step 606 may commence with the PSID 316 having the lowest-valued VSID 318 for the subject snapshot. As any segments 324 are filled according to the garbage collection process, they may also be evaluated to be finalized or subject to garbage collection as described below.

The method 600 may include evaluating 608 whether garbage collection is needed for the segment ID S. This may include comparing the amount of valid data in the physical segment 324 for the segment ID S to a threshold. For example, if only 40% of the data stored in the physical segment 324 for the segment ID S has been marked valid, then garbage collection may be determined to be necessary. Other thresholds may be used, such as value between 30% and 80%. In other embodiments, the amount of valid data is compared to the size of the physical segment 324, e.g., the segment ID S is determined to need garbage collection if the amount of valid data is less than X % of the size of the physical segment 324, where X is a value between 30 and 80, such as 40.

If garbage collection is determined 608 not to be needed, the method 600 may include finalizing 610 the segment ID S. Finalizing may include flagging the segment ID S in the segment map 314 as full and no longer available to be written to. This flag may be stored in another table that lists finalized PSIDs 316.

If garbage collection is determined 608 to be needed, then the method 600 may include writing 612 the valid data to a new segment. For example, if the valid data may be written to a current PSID 316, i.e. the most-recently allocated PSID 316 for the subject snapshot, until its corresponding physical segment 324 full. If there is no room in the physical segment 324 for the current PSID 316, step 612 may include assigning a new PSID 316 as the current PSID 316 for the subject snapshot. The valid data, or remaining valid data, may then be written to the physical segment 324 corresponding to the current PSID 316 for the subject snapshot.

Note that writing 612 the valid data to the new segment maybe processed in the same manner as for any other write request (see FIG. 4) except that the snapshot ID used will be the snapshot ID 340 of the subject snapshot, which may not be the current snapshot ID. In particular, the manner in which the new PSID 316 is allocated to the subject snapshot may be performed in the same manner described above with respect to steps 406-48 of FIG. 4. Likewise, the manner in which the valid data is written to the current segment may be performed in the same manner as for steps 410-412 of FIG. 4. In some embodiments, writing of valid data to a new segment as part of garbage collection may also include updating the block map with the new location of the data for an LBA 332, such as according to steps 414-418 of FIG. 4. When the physical segment 324 of the current PSID 316 is found to be full, it may itself be subject to the process 600 by which it is finalized or subject to garbage collection.

After the valid data is written to a new segment, the method 600 may further include freeing 614 the PSID S in the segment map 314, e.g., marking the entry in segment map 314 corresponding to PSID S as free.

The process of garbage collection may be simplified for PSIDs 316 that are associated with the subject snapshot in the segment map 314 but are not listed in the block map 338 with respect to any LBA 332. The physical segments 324 of such PSIDs 316 do not store any valid data. Entries for such PSIDs 316 in the segment map 314 may therefore simply be deleted and marked as free in the segment map 314

Figure 7:
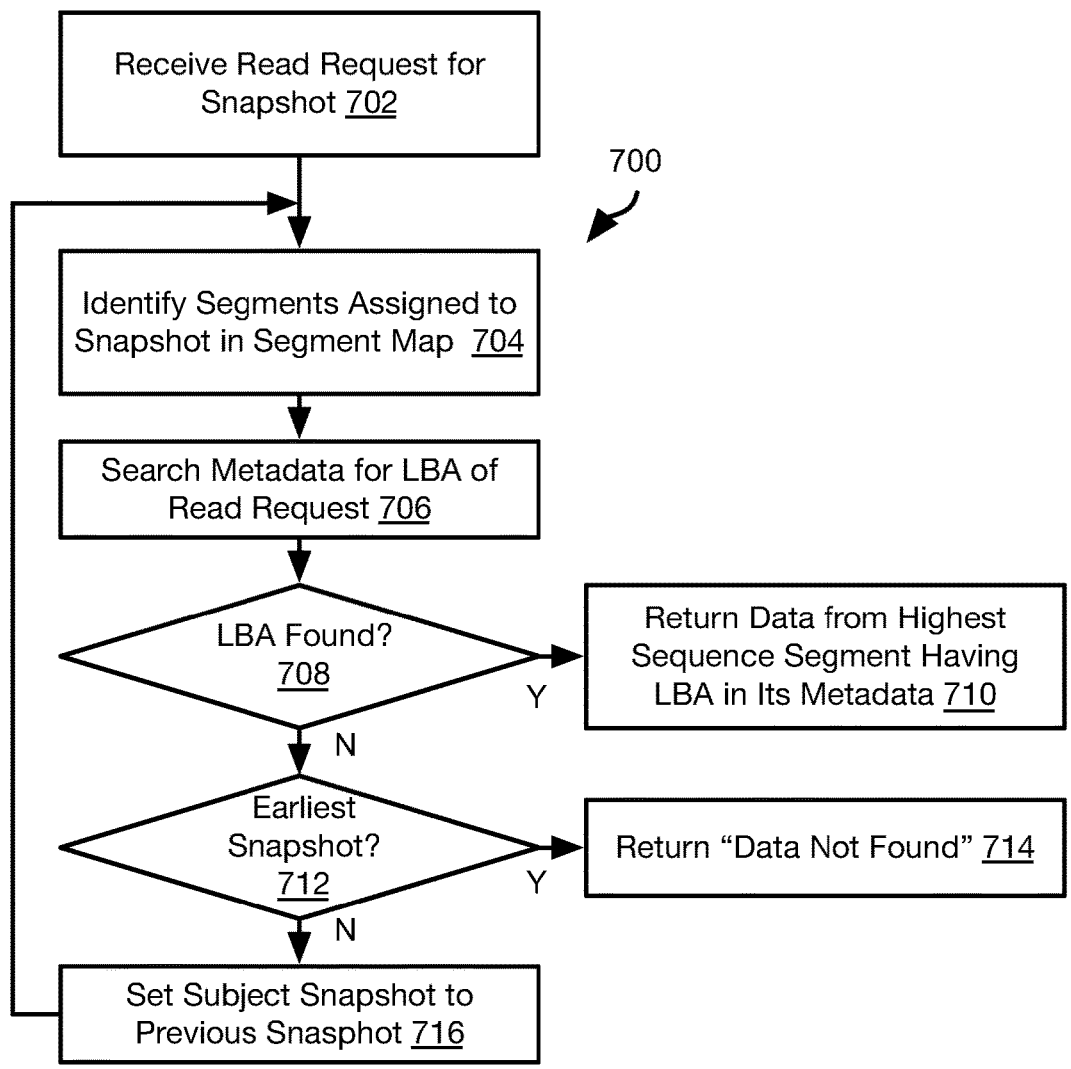
FIG. 7 is a process flow diagram of a method for reading data from a snapshot in accordance with an embodiment of the present invention.

FIG. 7 illustrates a method 700 that may be executed by a storage node 106 in response to a read request. The read request may be received from an application executing on a compute node 110. The read request may include such information as a snapshot ID, volume ID (and/or slice ID), LBA, and size (e.g. number of 4 KB blocks to read).

The following steps of the method 700 may be initially executed using the snapshot ID 340 included in the read request as "the subject snapshot," i.e., the snapshot that is currently being processed to search for requested data. The method 700 includes receiving 702 the read request by the storage node 106 and identifying 704 one or more PSIDs 316 in the segment map 314 assigned to the subject snapshot and searching 706 the metadata entries for these PSIDs 316 for references to the LBA 332 included in the read request.

The searching of step 706 may be performed in order of decreasing VSID 318, i.e. such that the metadata entries for the last allocated PSID 316 is searched first. In this manner, if reference to the LBA 332 is found, the metadata of any previously-allocated PSIDs 316 does not need to be searched.

Searching 706 the metadata for a PSID 316 may include searching one or more index pages 328 of the physical segment 324 corresponding to the PSID 316. As noted above, one or more index pages 328 are stored at the second end of the physical segment 324 and entries are added to the index pages 328 in the order they are received. Accordingly, the last-written metadata including the LBA 332 in the last index page 328 (furthest from the second end of the physical segment 324) in which the LBA 332 is found will correspond to the valid data for that LBA 332. To locate the data 326 corresponding to the last-written metadata for the LBA 332 in the physical segment 324, the sizes 336 for all previously-written metadata entries may be summed to find a start address in the physical segment 324 for the data 326. Alternatively, if the physical offset 334 is included, then the data 326 corresponding to the metadata may be located without summing the sizes 336.

If reference to the LBA 332 is found 708 in the physical segment 324 for any of the PSIDs 316 allocated to the subject snapshot, the data 326 corresponding to the last-written metadata entry including that LBA 332 in the physical segment 324 mapped to the PSID 316 having the highest VSID 318 of all PSIDs 316 in which the LBA is found will be returned 710 to the application that issued the read request.

If the LBA 332 is not found in the metadata entries for any of the PSIDs 316 mapped to subject snapshot, the method 700 may include evaluating 712 whether the subject snapshot is the earliest snapshot for the storage volume of the read request on the storage node 106. If so, then the data requested is not available to be read and the method 700 may include returning 714 a "data not found" message or otherwise indicating to the requesting application that the data is not available.

If an earlier snapshot than the subject snapshot is present for the storage volume on the storage node 106, e.g., there exists at least one PSID 316 mapped to a snapshot ID 340 that is lower than the snapshot ID 340 of the subject snapshot ID, then the immediately preceding snapshot ID 340 will be set 716 to be the subject snapshot and processing will continue at step 704, i.e. the PSIDs 316 mapped to the subject snapshot will be searched for the LBA 332 in the read request as described above.

The method 700 is particularly suited for reading data from snapshots other than the current snapshot that is currently being written to. In the case of a read request from the current snapshot, the block map 338 may map each LBA 332 to the PSID 316 in which the valid data for that LBA 332 is written. Accordingly, for such embodiments, step 704 may include retrieving the PSID 332 for the LBA 332 in the write request from the block map 338 and only searching 706 the metadata corresponding to that PSID 316. Where the block map 338 stores a physical offset 334, then the data is retrieved from that physical offset within the physical segment 314 of the PSID 336 mapped to the LBA 332 of the read request.

In some embodiments, the block map 332 may be generated for a snapshot other than the current snapshot in order to facilitate executing read requests, such as where a large number of read requests are anticipated in order to reduce latency. This may include searching the index pages 328 of the segments 324 allocated to the subject snapshot and its preceding snapshots to identify, for each LBA 332 to which data has been written, the PSID 316 having the highest VSID 318 of the PSIDs 316 having physical segments 324 storing data written to the each LBA 332. This PSID 316 may then be written to the block map 318 for the each LBA 332. Likewise, the physical offset 334 of the last-written data for that LBA 332 within the physical segment 324 for that PSID 316 may be identified as described above (e.g., as described above with respect to steps 704-716).

Figure 8:
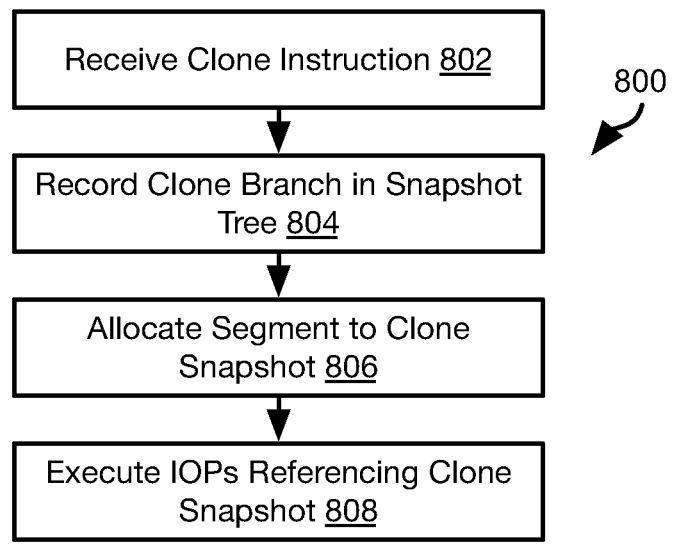
FIG. 8 is a process flow diagram of a method for cloning a snapshot in accordance with an embodiment of the present invention.

Referring to FIG. 8, in some instances it may be beneficial to clone a storage volume. This may include capturing a current state of a principal copy of a storage volume and making changes to it without affecting the principal copy of the storage volume. For purposes of this disclosure a "principal copy" or "principal snapshot" of a storage volume refers to an actual production copy that is part of a series of snapshots that is considered by the user to be the current, official, or most up-to-date copy of the storage volume. In contrast, a clone snapshot is a snapshot created for experimentation or evaluation but changes to it are not intended by the user to become part of the production copy of the storage volume. Stated differently, only one snapshot may be a principal snapshot with respect to an immediately preceding snapshot, independent of the purpose of the snapshot. Any other snapshots that are immediate descendants of the immediately preceding snapshot are clone snapshots.

The illustrated method 800 may be executed by the storage manager 102 and one or more storage nodes 106 in order to implement this functionality. The method 800 may include receiving 802 a clone instruction and executing the remaining steps of the method 800 in response to the clone instruction. The clone instruction may be received by the storage manager 102 from a user or be generated according to a script or other program executing on the storage manager 102 or a remote computing device in communication with the storage manager 102.

The method 800 may include recording 804 a clone branch in a snapshot tree. For example, referring to FIG. 9, in some embodiments, for each snapshot that is created for a storage volume, the storage manager 102 may create a node S1-S5 in a snapshot hierarchy 900. In response to a clone instruction, the storage manager 102 may create a clone snapshot and branch to a node A1 representing the clone snapshot. In the illustrated example, a clone instruction was received with respect to the snapshot of node S2. This resulted in the creation of clone snapshot represented by node A1 that branches from node S2. Note node S3 and its descendants are also connected to node S2 in the hierarchy.

In some embodiments, the clone instruction may specify which snapshot the clone snapshot is of In other embodiments, the clone instruction may be inferred to be a snapshot of a current snapshot. In such embodiments, a new principal snapshot may be created and become the current snapshot. The previous snapshot will then be finalized and be subject to garbage collection as described above. The clone will then branch from the previous snapshot. In the illustrated example, if node S2 represented the current snapshot, then a new snapshot represented by node S3 would be created. The snapshot of node S2 would then be finalized and subject to garbage collection and clone snapshot represented by A1 would be created and node A1 would be added to the hierarchy as a descendent of node S2.

In some embodiments, the clone node A1, and possibly its descendants A2 to A4 (representing subsequent snapshots of the clone snapshot), may be distinguished from the nodes S1 to S5 representing principal snapshots, such as by means of a flag, a classification of the connection between the node A1 and node S2 that is its immediate ancestor, or by storing data defining node A1 in a separate data structure.

Following creation of a clone snapshot, other principal snapshots of the storage volume may be created and added to represented in the hierarchy by one or more nodes S2 to S5. A clone may be created of any of these snapshots and represented by additional clone nodes. In the illustrated example, node B1 represents a clone snapshot of the snapshot represented by node S4. Subsequent snapshots of the clone snapshot are represented by nodes B1 to B3.

Referring again to FIG. 8, the creation of a clone snapshot on the storage node 106 may be performed in the identical manner as for any other snapshot, such as according to the methods of FIGS. 2 through 6. In particular, one or more segments 806 may be allocated to the clone snapshot on storage nodes 106 storing slices of the cloned storage volume and mapped to the clone snapshot. IOPs referencing the clone snapshot may be executed 808, such as according to the method 400 of FIG. 4.

In some instances, it may be desirable to store a clone snapshot on a different storage node 106 than the principal snapshots. Accordingly, the method 800 may include allocating 806 segments to the clone snapshot on the different storage node 106. This may be invoked by sending a new snapshot instruction referencing the clone snapshot (i.e., an identifier of the clone snapshot) to the different storage node 106 and instructing one or more compute nodes 110 to route IOPs for the clone snapshot to the different storage node 106.

The storage node 102 may store in each node of the hierarchy, data identifying one or more storage nodes 106 that store data for the snapshot represented by that node of the hierarchy. For example, each node may store or have associated therewith one or more identifiers of storage nodes 106 that store a particular snapshot ID for a particular volume ID. The node may further map one or more slice IDs (e.g., slice offsets) of a storage volume to one storage nodes 106 storing data for that slice ID and the snapshots for that slice ID.

Figure 10:
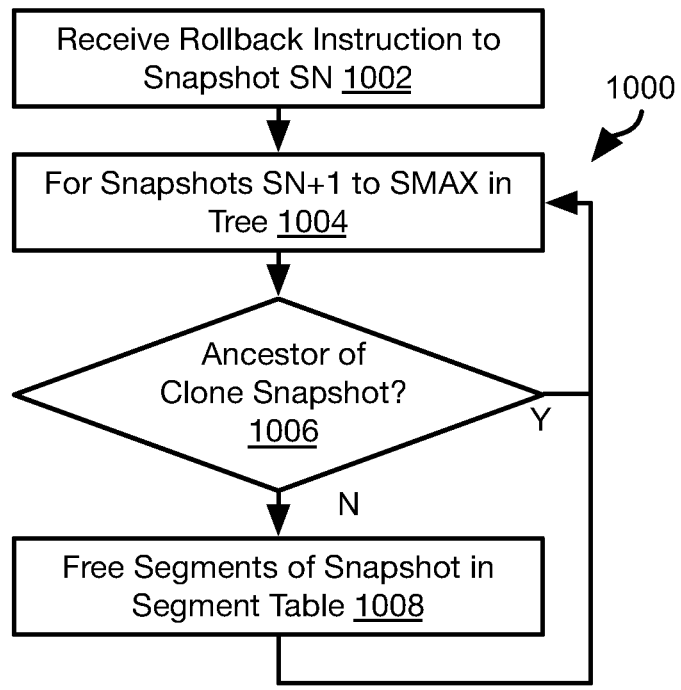
FIG. 10 is a process flow diagram of a method for rolling back to a prior snapshot in accordance with an embodiment of the present invention.

Referring to FIG. 10, one of the benefits of snapshots is the ability to capture the state of a storage volume such that it can be restored at a later time. FIG. 10 illustrates a method 1000 for rolling back a storage volume to a previous snapshot, particularly for a storage volume having one or more clone snapshots.

The method 1000 includes receiving 1002, by the storage manager 102, an instruction to rollback a storage volume to a particular snapshot SN. The method 1000 may then include processing 1004 each snapshot that is a represented by a descendent node of the node representing snapshot SN in the snapshot hierarchy, i.e. snapshots SN+1 to SMAX, where SMAX is the last principal snapshot that is a descendent of snapshot SN (each "descendent snapshot"). For each descendent snapshot, processing 1004 may include evaluating 1006 whether the each descendent is an ancestor of a node representing a clone snapshot. If not, then the storage manager 102 may instruct all storage nodes 106 storing segments mapped to the descendent snapshot to free 1008 these segments, i.e. delete entries from the segment map referencing the descendent snapshot and marking corresponding PSIDs 316 as free in the segment map 314.

If the descendent snapshot is found 1006 to be an ancestor of a clone snapshot, then step 1008 is not performed and the snapshot and any segments allocated to it are retained.

Figure 11:
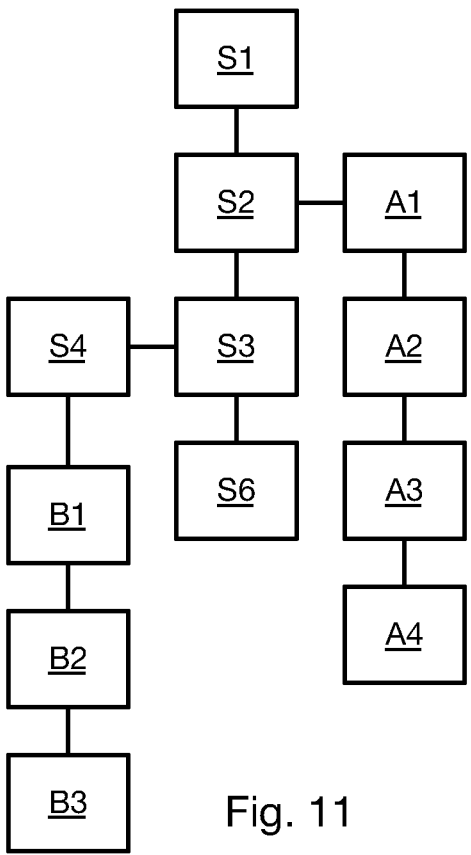
FIG. 11 illustrates the snapshot hierarchy of FIG. 9 as modified according to the method of FIG. 10 in accordance with an embodiment of the present invention.

FIG. 11 illustrates the snapshot hierarchy following execution of the method 1000 with respect to the snapshot represented by node S3. As is apparent, snapshot S5 has been removed from the hierarchy and any segments corresponding to these snapshots will have been freed on one or more storage nodes 106.

However, since node S4 is an ancestor of clone node B1, it is not removed and segments corresponding to it are not freed on one or more storage nodes in response to the roll back instruction. Inasmuch as each snapshot contains only data written to the storage volume after it was created, previous snapshots may be required to recreate the storage volume. Accordingly, the snapshots of nodes S3 to S1 are needed to create the snapshot of the storage volume corresponding to node B1.

Subsequent principal snapshots of the storage volume will be added as descendants of the node to which the storage volume was rolled back. In the illustrated example, a new principal snapshot is represented by node S6 that is an immediate descendent of node S3. Node S4 is only present due to clone node B1 and therefore may itself be classified as a clone node in the hierarchy in response to the rollback instruction of step 1002.

Note that FIG. 11 is a simple representation of a hierarchy. There could be any number of clone snapshots, clones of clone snapshots and descendent snapshots of any of these snapshots represented by nodes of a hierarchy. Accordingly, to roll back to a particular snapshot of a clone, the method 1000 is the same, except that descendants of the clone snapshot are treated the same as principal snapshots and clones of any of these descendants are treated the same as a clone snapshot.

Figure 12:
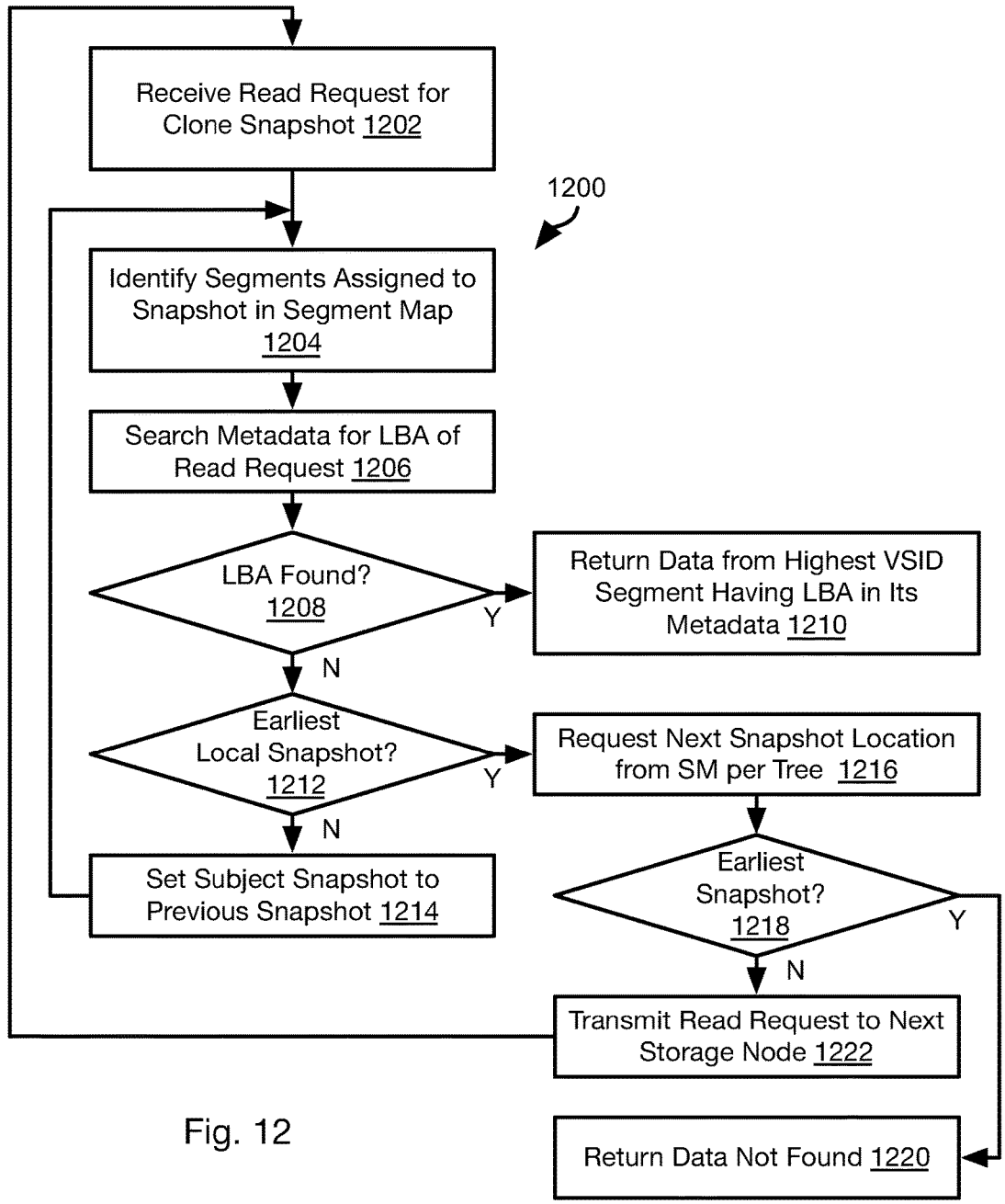
FIG. 12 is a process flow diagram of a method for reading from a clone snapshot in accordance with an embodiment of the present invention.

Referring to FIG. 12, the illustrated method 1200 may be used to execute a read request with respect to a storage volume that is represented by a hierarchy generated as described above with respect to FIGS. 8 through 11. The illustrated method 1200 may also be executed with respect to a storage volume that includes only principal snapshots that are distributed across multiple storage nodes, i.e., all the segments corresponding to snapshots of the same slice of the storage volume are not located on the same storage node 106. In that case, the hierarchy stored on the storage manager 102 stores the location of the segments for each snapshot and therefore enables them to be located.

The method 1200 may be executed by a storage node 106 ("the current storage node") with information retrieved from the storage manager 102 as noted below. The method 1200 may include receiving 1202 a read request, which may include such information as a snapshot ID, volume ID (and/or slice ID), LBA, and size (e.g. number of 4 KB blocks to read).

Note that the read request may be issued by an application executing on a compute node 110. The compute node 110 may determine which storage node 106 to transmit the read request using information from the storage manager 102. For example, the compute node 110 may transmit a request to obtain an identifier for the storage node 102 storing data for a particular slice and snapshot of a storage volume. The storage manager may then obtain an identifier and/or address for the storage node 106 storing that snapshot and slice of the storage volume from the hierarchical representation of the storage volume and return it to the requesting compute node 110. For example, the storage manager 102 may retrieve this information from the node in the hierarchy representing the snapshot included in the read request.

In response to the read request, the current storage node performs the algorithm illustrated by subsequent steps of the method 1200. In particular, the method 1200 may include identifying 1204 segments assigned to the snapshot ID of the read request in the segment ("the subject snapshot").

The method 1200 may include searching 1206 the metadata of the segments identified in step 1204 for the LBA of the read request. If the LBA is found, the data from the highest numbered segment having the LBA in its metadata is returned, i.e. the data that corresponds to the last-written metadata entry including the LBA.

If the LBA is not found in any of the segments mapped to subject snapshot, then the method 1200 may include evaluating 1212 whether the subject snapshot is the earliest snapshot on the current storage node. If not, then steps processing continues at step 1204 with the previous snapshot set 1214 as the subject snapshot.

Steps 1204-1214 may be performed in the same manner as for steps 704-714 of the method 700, including the various modifications and variations described above with respect to the method 700.

In contrast to the method 700, if the LBA is not found in any of the segments corresponding to the subject snapshot for any of the snapshots evaluated, then the method 1200 may include requesting 1216 a location, e.g. storage node identifier, where an earlier snapshot for the volume ID or slice ID is stored. In response to this request, the storage manager 102 determines an identifier of a storage node 106 storing the snapshot corresponding to the immediate ancestor of the earliest snapshot stored on the current storage node in the hierarchy. The storage manager 102 may determine an identifier of the storage node 106 relating to the immediate-ancestor snapshot and that stores data for a slice ID and volume ID of the read request as recorded for the ancestor nearest ancestor node in the hierarchy of the node corresponding to the earliest snapshot stored on the current storage node.

If the current storage node is found 1218 to be the earliest snapshot for the storage volume ID and/or slice ID of the read request, then the data the storage manager 102 may report this fact to the storage node, which will then return 1220 a message indicating that the requested LBA is not available for reading, such as in the same manner as step 714 of the method 700.

If another storage node stores an earlier snapshot for the volume ID and/or slice ID of the read request, then the read request may be transmitted 1222 to this next storage node by either the current storage node or the storage manager 102. The processing may then continue at step 1202 with the next storage node as the current storage node. The read request transmitted at step 1222 may have a snapshot ID set to the latest snapshot ID for the storage volume ID and or slice ID of the original read request.

The method 1200 may be performed repeatedly across multiple storage nodes 106 until the earliest snapshot is encountered at the LBA of the read request is located.

Figure 13:
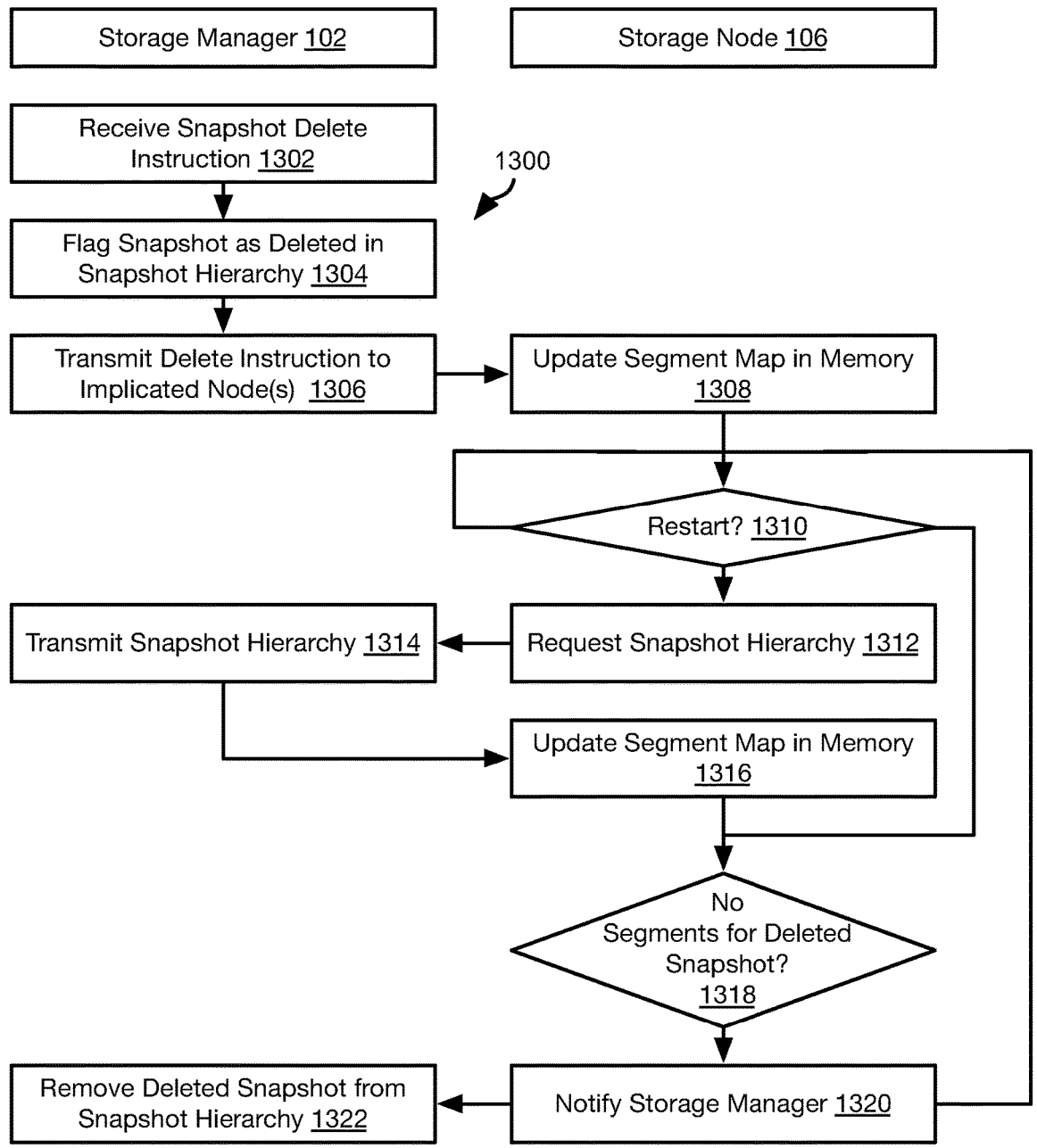
FIG. 13 is a process flow diagram of a method for deleting snapshots in accordance with an embodiment of the present invention.

FIG. 13 illustrates a method 1300 for deleting snapshots. The method 1300 may include receiving 1302, by the storage manager 102, an instruction to delete a snapshot ("the subject snapshot") for a storage volume ("the subject volume"). The instruction may be received from a user or from a script or other scheduling program that deletes snapshots after a certain amount of time or when they are otherwise no longer needed.

Figure 9:
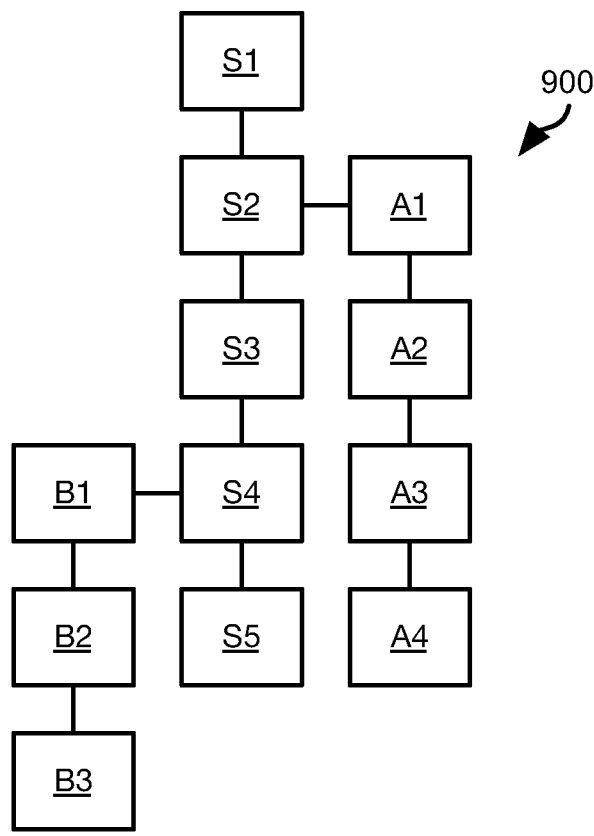
FIG. 9 illustrates a snapshot hierarchy created in accordance with an embodiment of the present invention.

In response, the storage manager 102 flags 1304 the subject snapshot as deleted in the snapshot hierarchy for the subject volume. The instruction of step 1302 may include an identifier of the subject snapshot and subject volume. For example, in the hierarchy of FIG. 9, snapshot S1 may be deleted. Accordingly, the hierarchy as shown in FIG. 9 would remain unchanged except that an annotation would associated with the hierarchy that indicates that S1 is now deleted.

The storage manager 102 then transmits 1306 an instruction to delete the snapshot to all implicated storage nodes. For example, as shown in FIG. 3, the volume map 300 for the subject volume may indicate the node 302 on which a slice having a given address (offset 304) is stored. Accordingly, the instruction may be transmitted to the storage node 106 corresponding to each node ID 302 mapped to the subject volume. The instruction may include identifiers of the subject snapshot and subject volume.

Upon receiving the instruction, each storage node 106 that receives it may update 1308 its segment map 314 as stored in memory without updating a persistent copy of the segment map 314 stored on a storage device 108 (e.g., hard disk drive (HDD), solid state drive (SSD)) of that storage node 106. In this manner, the delete instruction does not impair production IOP processing by the storage node 106 on the storage device 108.

Updating 1308 the segment map 314 may include removing reference to the deleted storage node. For example, suppose snapshots are designated S(i), i=1 to N, with N being the number of snapshots and S(N) being the latest snapshot. If an instruction is received to delete S(M), M<N, then all references to snapshots S(M) in the segment map 314 in memory will be changed to S(M+1), or the earliest non-deleted snapshot following SM. Accordingly, for each PSID 316 including a snapshot ID 340 corresponding to S(M) will be changed such that the snapshot ID 340 references S(M+1). A persistent copy of the segment map 314 in memory will still refer to S(M) in the entries corresponding to those same PSIDs 316.

In the event that the storage node 106 crashes or otherwise is found 1310 to be restarted, the segment map 314 in memory will be lost. In response to detecting 1310 restarting, the storage node 106 will therefore request 1312 the snapshot hierarchy from the storage manager 102, which then transmits 1314 the snapshot hierarchy to the storage node 106.

In response to receiving the snapshot hierarchy, the storage node 106 then reads the persistent copy of segment map 314 from its storage location on the storage device 108 into memory. The storage node 108 again updates 1316 the segment map 314 in memory without updating the persistent copy of the storage map 314. The updating may be performed in the same manner as for step 1308 with references to any snapshots that are flagged as deleted in the snapshot hierarchy being changed as described above with respect to step 1308.

Multiple snapshots may have been deleted prior to restarting being detected 1310. However, the process is the same: all references to deleted snapshots SM in the segment map 314 in memory will be changed to S(M+1), or the earliest non-deleted snapshot following S(M). In this case a "non-deleted" snapshot is a snapshot that is not flagged as deleted in the snapshot hierarchy.

As described above, garbage collection (see FIG. 6) is performed for snapshots. As described above, segments that have little valid data may have that valid data written to a new segment and then marked as free in the segment map 314. As a result of this process, it can be expected that the segments referencing a deleted snapshot will eventually all be marked as free.

Accordingly, the storage node 106 may periodically evaluate 1318 the persistent copy of the segment map 314. In the event that all segments referring to a deleted snapshot are found 1318 to have been freed, either with or without reallocation, then the storage node 106 may notify 1320 the storage manager 102, such as by transmitting an identifier of the deleted snapshot and its corresponding storage volume to the storage manager 102 with a message indicating that it is no longer referenced.

Whether a segment referencing the deleted snapshot has been freed may be determined by comparing the VSIDs 318 of the segment maps. If the Slice ID 310 and VSID 318 of a PSID 316 entry corresponding to the deleted snapshot in the persistent copy of the segment map 314 do not match the both the Slice ID 310 and VSID 318 of the entry for the same PSID 316 in the segment map 314 in memory, then that PSID 316 has been freed and reallocated. Of course, if the entry in memory is flagged as free for a PSID 316, then this clearly indicates that the segment has been garbage collected and is no longer allocated to the deleted snapshot.

In response, the storage manager 102 deletes 1322 reference to the deleted snapshot from the snapshot hierarchy for the storage volume identified in the notification of step 1320. Using the example of FIG. 9, where S1 is deleted, the hierarchy would be updated to remove reference to it such that S2 is the oldest snapshot in the hierarchy.

Where a snapshot that is deleted has a clone snapshot as a descendent, then the deleted snapshot may become a clone node in a branch including the clone snapshot but not be deleted, as discussed above. If a snapshot is deleted that is the only non-clone ancestor of a clone node, then the deleted snapshot and any descendent clone nodes are no longer connected to the snapshot hierarchy and may be treated as a separate snapshot hierarchy. For example, if S1 and S2 were to be deleted in FIG. 9, A1 to A4 would no longer have any connection to snapshots S3-S5 and would be unaffected by subsequent changes to the original snapshot hierarchy.

Note that the only disk writes required for deletion of a snapshot on the storage node are those that would occur during normal operation as a result of garbage collection. Accordingly, deletion of a snapshot does not significantly interfere with processing of production IOPs.

Figure 14A:
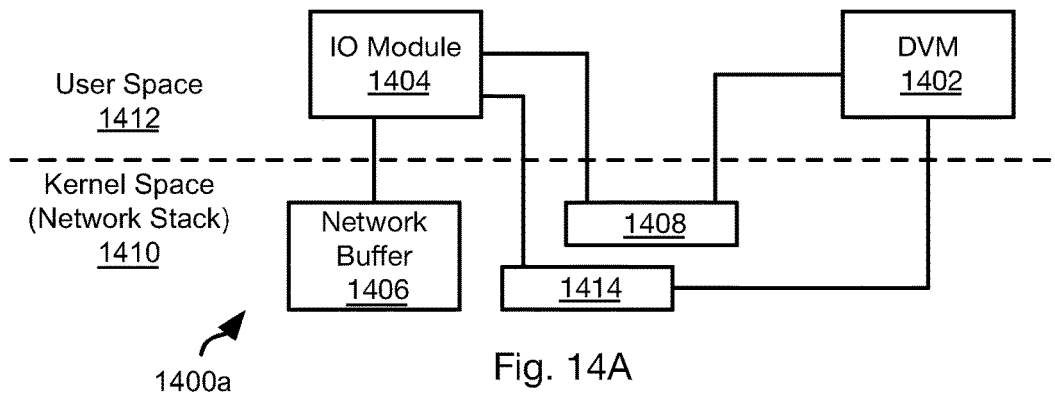
FIGS. 14A and 14B are diagrams illustrating approaches for the processing of IOPs on a hybrid node in accordance with an embodiment of the present invention.

Referring to FIG. 14A in some instances a compute node 110 also operates as a storage node 106. This may be the case where network latency must be reduced. Accordingly, a storage node 106 may be required to process IOPs that are generated locally and those that are received over a network from a remote compute node 110.

In the illustrated configuration 1400a, a disk virtualization manager (DVM) 1402 executes the functions ascribed to a storage node 106 in the above-described methods. The DVM 1402 may be implemented as a daemon executing on the storage node that is invoked by a kernel in response to procedure calls referencing it, including remote procedure calls (RPCs) from remote compute noes 110.

Inasmuch as the DVM 1402 is configured as a network service, local IOPs may be routed in a manner such that the DVM 1402 processes them in the same manner as IOPs received as RPCs. For example, an IOP from a locally executing application may be sent to a network buffer 1406 of the storage node 106 and be addressed to an IO (input-output) module 1404 executing on the storage node 106, such as a daemon process.

The IO module 1404 determines that the IOP is for the local DVM 1402 and copies the IOP to memory 1408 of the network stack of a kernel space 1410 in the form of RPC addressed to the DVM 1402. The IO module 1404 and DVM 1402 may operate in user application space 1412. The kernel then processes the RPC from memory 1408 and routes it to the DVM 1402, which then processes the IOP by executing a read or write operation, such as according to the methods described above.

A response to the IOP may be copied to memory 1414 in the network stack in kernel space 1410, such as in the form of a RPC addressed to the IO module 1404. The IO module 1404 receives the response and then returns it to the network stack of kernel space 1410 addressed to the application from which it was received.

If the IO module 1404 receives and IOP for a remote storage node 106, the IO module 1404 may transmit the IOP to the remote storage node 106 as a RPC transmitted through the network stack of the kernel space 1410.

As is apparent, this approach is complex and requires various intermediate steps in order to simulate an RPC addressed to the RVM even though the application issuing the IOP is executing on the same storage node 106 as the DVM 1402.

Figure 14B:
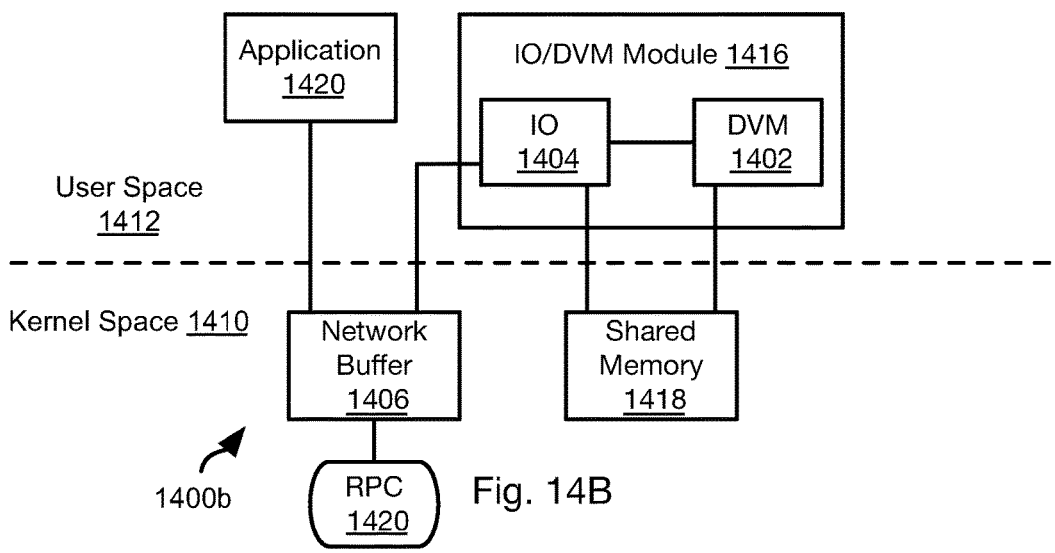

FIG. 14B illustrates an alternative approach 1400b for implementing a hybrid storage node 106 that also functions as a compute node 110. In this approach, the IO module 1404 and DVM 1402 are components of a single process 1416 that may operate as a daemon or other persistent service executing on the storage node 106.

The modules 1404, 1402 may communicate with one another by means of library function calls to one another and by way of shared memory 1408 in kernel space 1410. A local application 1420 executing in user space will then issue IOPs to the network buffer 1406 in kernel space 1410, which will be addressed to the IO module 1404 of the unified process 1416. IOPs addressed to a remote storage node 106 may be transmitted to that storage node 106 by means of an RPC 1420 issued by the kernel in response to receiving the IOP from the application 1420 or as instructed by the IO module 1404.

Figure 15A:
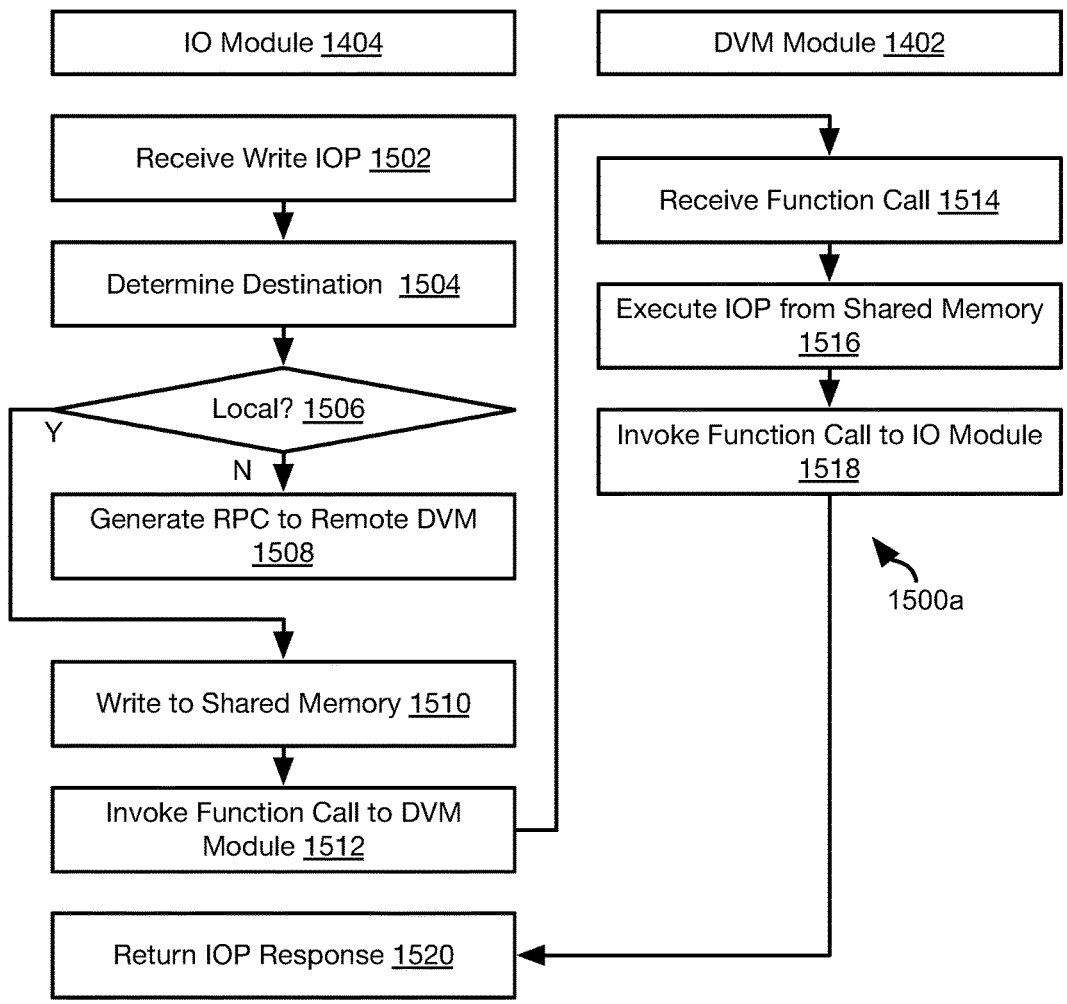
FIG. 15A is a process flow diagram of a method for processing write IOPs on a hybrid node in accordance with an embodiment of the present invention.
Figure 15B:
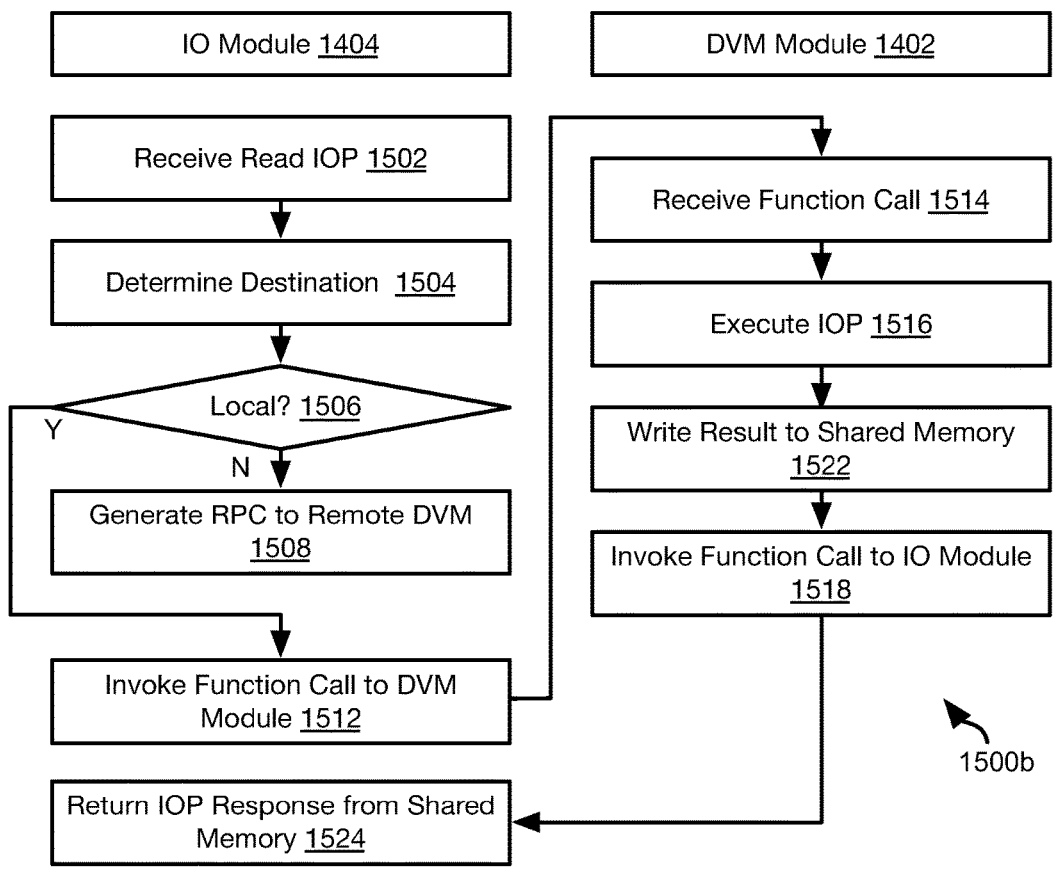
FIG. 15B is a process flow diagram of a method for processing read IOPs on a hybrid node in accordance with an embodiment of the present invention.

FIGS. 15A and 15B illustrate methods 1500a, 1500b showing details of the approach 1400b. FIG. 15A illustrates a method for processing a write IOP using the IO module 1404 and DVM module 1402 of the unified process 1416. The method 1500a includes receiving 1502 an IOP by the IO module 1404 from an application 1420 operating in user space 1412, such as by way of the network buffer 1406 from kernel space 1410. In other approaches, the application may address an IOP to the IO module 1404 through some other process in kernel space 1410 or user space 1412.

The IO module 1404 determines 1504 a destination of the IOP, such as in the form of an IP address, storage node identifier, or other addressing information. If the destination is found 1506 not to be local, the IO module 1404 transmits the IOP to the DVM module 1402 of the remote storage node 106 addressed by the IOP. The DVM module 1402 of the remote storage node may be part of a unified process 1416 on that node or may be implemented according to the approach 1400a. The IO module 1404 may transmit the IOP by generating an RPC 1508 in kernel space 1410 that is transmitted by the kernel to the remote storage node 106.

If the destination is found 1506 to be local, payload data from the write IOP may be written 1510 to the shared memory 1418 in kernel space 1410. The payload data is the data requested to be written to persistent storage on the storage node 106 by the IOP.

The method 1500a further includes invoking 1512 a library function call to the DVM module 1402 of the unified process 1416. The library function call may be made directly to the DVM module 1402 directly through the unified process 1416 executing in user space 1412 and therefore does not require transmitting information through the network stack in kernel space 1410.

The DVM module 1402 receives 1514 the library call and, in response, executes 1516 the IOP using the payload data stored in the shared memory 1418. The function call may include data from the write IOP sufficient to identify the location to which the payload is to be written and may include the write IOP itself, other than the payload data. Executing 1516 the function call may include writing the payload data to the location referenced by the write IOP according to the method 400 or using any approach for processing write commands using any disk virtualization approach known in the art. Accordingly, the write IOP may include data sufficient to identify the location to write the data according to the method 400 or whichever disk virtualization approach is used.

The DVM module 1402 may then invoke 1518 a function call to the TO module 1518 within the unified process 1418 indicating a result of the TOP, e.g. an acknowledgment of successful completion, an error message, or some other message. The TO module 1404, receives this function call and, in response, returns 1520 the response to the application 1420 either directly or by way of the network buffer 1406 in kernel space 1410.

FIG. 15B illustrates an example method 1500b for processing a read TOP using the approach 1400b. In the method 1500b, a read TOP is received and processed according to steps 1502-1508 in the same manner as a write TOP.

If the read TOP is found 1506 to be local, a function call is again invoked 1512 to the DVM module 1402. Inasmuch as a read TOP may not contain a significant amount of data, any writing to the shared memory 1418 may be omitted in this case. In other embodiments, some or all of the data of the read TOP is written to the shared memory 1418.

The DVM module 1402 receives 1514 and executes 1516 the function call as for the method 1500a. For the method 1500b, the function call may include data from the read TOP sufficient to identify the data to be read or include the read TOP itself. Executing 1516 the function call may include reading the data referenced by the read TOP according to the method 700 or using any approach for processing read commands using any disk virtualization approach known in the art. Accordingly, the read TOP may include data sufficient to identify the location from which to read data according to the method 700 or whichever disk virtualization approach is used.

The DVM module 1402 may the write 1522 payload data read at step 1516 to the shared memory 1418 and invoke 1518 a function call within the unified process 1416 to the TO module 1404. For the method 1500b, the function call 1518 may indicate that a result of executing 1516 the read TOP, which may be a message indicating success, an error, or communicating some other information.

In response to receiving the function call of step 1518, the TO module 1404 returns 1524 a response to the application 1420 that issued the read TOP, which may include the payload data as read from the shared memory 1418 if the read command was successful. Where the read command was not successful, the TO module 1404 may forward the status message from step 1518 to the application 1420. Returning 1524 the response may include directly transmitting the response to the application 1420 or by way of the network buffer 1406 in kernel space 1410 or by some other process executing in kernel space 1410.

Figure 16:
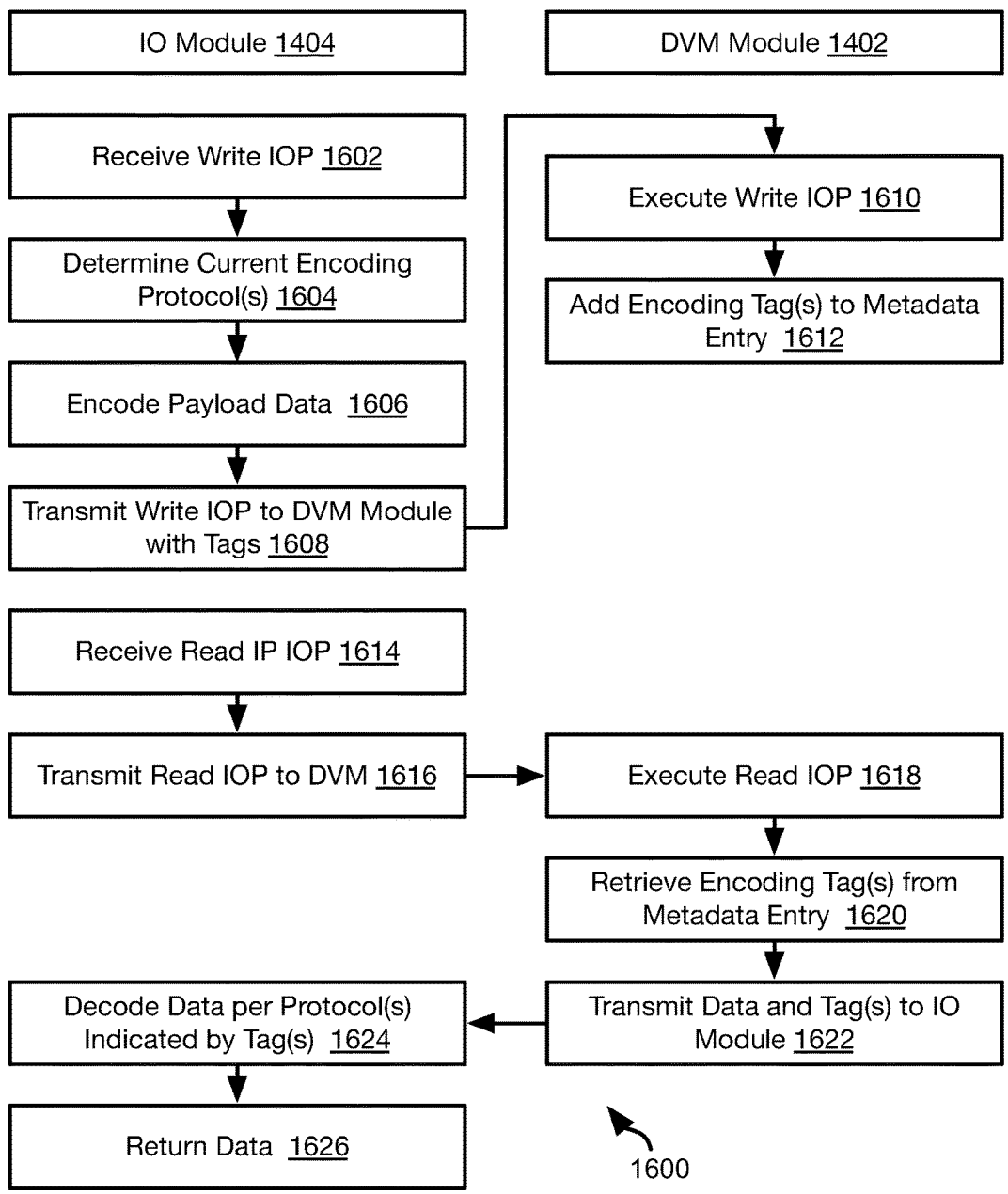
FIG. 16 is a process flow diagram of a method for annotating data with encoding tags in accordance with an embodiment of the present invention.

Referring to FIG. 16, in some instances, data may be encoded in some form prior to being written to a storage device 108. This encoding may be encryption, compression, addition of error correction codes, or any other type of encoding known in the art. Inasmuch as a storage volume may be in use over an extended period of time, an encoding protocol may change during its use. Accordingly, earlier stored data may use a different protocol than later stored data. The illustrated method 1600 may be used to make possible these changes in encoding while still enabling recovery of data.

The illustrated method 1600 may be preceded by an instruction to a storage node 106 to use a particular encoding protocol for a storage volume. The encoding protocol may be for encryption, compression, error correction, or some other purpose. This instruction may be received from the storage manager 102, such as in response to a user instruction to use a particular encoding protocol for a particular purpose.

The illustrated method 1600 is described as being performed by an TO module 1404 and DVM module 1402 that may be implemented according to the approach of FIG. 14A or 14B. Likewise, the distribution of actions between the TO module 1404 and DVM module 1402 is exemplary only and may be performed by a single component or a different component executing on a storage node 106. Accordingly, steps relating to communication among these components may be omitted in such embodiments.

The method 1600 may include receiving 1602 a write TOP from an application executing locally or on a remote compute node 110. The TO module 1404 determines 1604 one or more current encoding protocols specified for the storage volume referenced in the write TOP (encrypt, compress, error correction, etc.).

The TO module 1404 then encodes 1606 the payload data from the write TOP according to the one or more protocols determined at step 1604, which may include one or more of encrypting, compressing, and adding error correction. The TO module transmits 1608 the write TOP to the DVM module 1402 along with tags indicating the encoding protocols executed at step 1606.

The DVM module 1402 then executes 1610 the write TOP using the encoded payload data, i.e. writes the encoded payload data to an address included in the write TOP according to any method known in the art or according to any of the methods described above, such as the method 400 of FIG. 4.

The DVM module 1402 further adds 1612 the tags, or data representing the tags, transmitted 1616 with the write IOP to the metadata entry for the write IOP. In particular, as shown in FIG. 3, each write IOP may result in creation of a metadata entry in an index page 328 for each LBA 332 referenced in the write IOP. According to the method 1600, this metadata entry for each LBA 332 in an index page 328 will also include the tags, or a representation of data indicted by the tags, indicating the encoding protocols used to encode the payload data written to that LBA 332. Accordingly, there may be one or more tags depending on the protocols used, such as an encryption protocol tag, compression protocol tag, error correction code tag, or any other tag sufficient to identify an encoding protocol. Step 1612 may be performed as part of step 412 of the method 400 or at a different point in the execution of a write IOP.

Steps 1614-1626 illustrate an example approach for processing read IOPs with respect to data that has been encoded and written according to steps 1602-1612.

The IO module 1404 of the storage node 106 receives 1614 a read IOP from a local application or a remote compute node 110. The IO module 1404 transmits 1616 the read IOP to the DVM module 1402, which then executes 1618 the read IOP and retrieves payload data referenced by the read IOP using any method for executing read IOPs, such as according to the method 700 of FIG. 7.

The DVM module 1402 further retrieves 1620 the one or more tags from the metadata entry for the data read at step 1618, i.e. in the metadata entry for the LBA 332 referenced by the read IOP. The DVM module 1402 then transmits 1622 the payload data and one or more tags to the IO module 1404, which decodes 1624 the payload data using the protocols indicated by the tags to obtain the payload data as encoded at step 1606. The protocols may be applied in a reverse order than that in which they were applied at step 1606. Accordingly, the ordering of the tags as stored in the metadata may indicate the order in which protocols were applied at step 1606 such that corresponding decoding protocols may be performed in the correct reverse order. The decoded data may then be returned 1626 to the application that issued the read IOP at step 1614.

Figure 17:
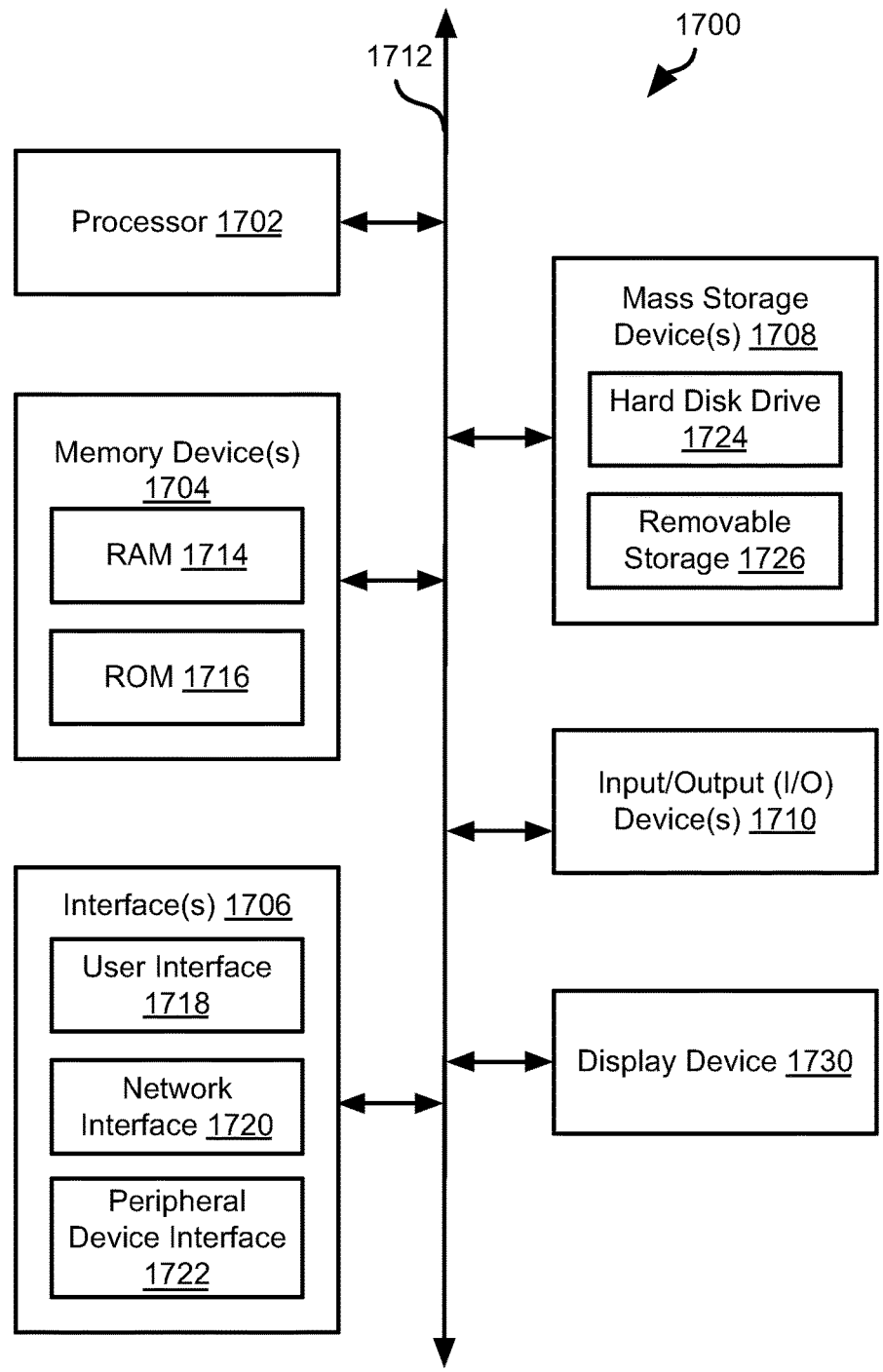
FIG. 17 is a schematic block diagram of an example computing device suitable for implementing methods in accordance with embodiments of the invention.

FIG. 17 is a block diagram illustrating an example computing device 1700. Computing device 1700 may be used to perform various procedures, such as those discussed herein. The storage manager 102, storage nodes 106, and compute nodes 110 may have some or all of the attributes of the computing device 1700.

Computing device 1700 includes one or more processor(s) 1702, one or more memory device(s) 1704, one or more interface(s) 1706, one or more mass storage device(s) 1708, one or more Input/output (I/O) device(s) 1710, and a display device 1730 all of which are coupled to a bus 1712. Processor(s) 1702 include one or more processors or controllers that execute instructions stored in memory device(s) 1704 and/or mass storage device(s) 1708. Processor(s) 1702 may also include various types of computer-readable media, such as cache memory.

Memory device(s) 1704 include various computer-readable media, such as volatile memory (e.g., random access memory (RAM) 1714) and/or nonvolatile memory (e.g., read-only memory (ROM) 1716). Memory device(s) 1704 may also include rewritable ROM, such as Flash memory.

Mass storage device(s) 1708 include various computer readable media, such as magnetic tapes, magnetic disks, optical disks, solid-state memory (e.g., Flash memory), and so forth. As shown in FIG. 17, a particular mass storage device is a hard disk drive 1724. Various drives may also be included in mass storage device(s) 1708 to enable reading from and/or writing to the various computer readable media. Mass storage device(s) 1708 include removable media 1726 and/or non-removable media.

I/O device(s) 1710 include various devices that allow data and/or other information to be input to or retrieved from computing device 1700. Example I/O device(s) 1710 include cursor control devices, keyboards, keypads, microphones, monitors or other display devices, speakers, printers, network interface cards, modems, lenses, CCDs or other image capture devices, and the like.

Display device 1730 includes any type of device capable of displaying information to one or more users of computing device 1700. Examples of display device 1730 include a monitor, display terminal, video projection device, and the like.

Interface(s) 1706 include various interfaces that allow computing device 1700 to interact with other systems, devices, or computing environments. Example interface(s) 1706 include any number of different network interfaces 1720, such as interfaces to local area networks (LANs), wide area networks (WANs), wireless networks, and the Internet. Other interface(s) include user interface 1718 and peripheral device interface 1722. The interface(s) 1706 may also include one or more peripheral interfaces such as interfaces for printers, pointing devices (mice, track pad, etc.), keyboards, and the like.

Bus 1712 allows processor(s) 1702, memory device(s) 1704, interface(s) 1706, mass storage device(s) 1708, I/O device(s) 1710, and display device 1730 to communicate with one another, as well as other devices or components coupled to bus 1712. Bus 1712 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 1700, and are executed by processor(s) 1702. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

In the above disclosure, reference has been made to the accompanying drawings, which form a part hereof, and in which is shown by way of illustration specific implementations in which the disclosure may be practiced. It is understood that other implementations may be utilized and structural changes may be made without departing from the scope of the present disclosure. References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Implementations of the systems, devices, and methods disclosed herein may comprise or utilize a special purpose or general-purpose computer including computer hardware, such as, for example, one or more processors and system memory, as discussed herein. Implementations within the scope of the present disclosure may also include physical and other computer-readable media for carrying or storing computer-executable instructions and/or data structures. Such computer-readable media can be any available media that can be accessed by a general purpose or special purpose computer system. Computer-readable media that store computer-executable instructions are computer storage media (devices). Computer-readable media that carry computer-executable instructions are transmission media. Thus, by way of example, and not limitation, implementations of the disclosure can comprise at least two distinctly different kinds of computer-readable media: computer storage media (devices) and transmission media.

Computer storage media (devices) includes RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

An implementation of the devices, systems, and methods disclosed herein may communicate over a computer network. A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links, which can be used to carry desired program code means in the form of computer-executable instructions or data structures and which can be accessed by a general purpose or special purpose computer. Combinations of the above should also be included within the scope of computer-readable media.

Computer-executable instructions comprise, for example, instructions and data which, when executed at a processor, cause a general purpose computer, special purpose computer, or special purpose processing device to perform a certain function or group of functions. The computer executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the disclosure may be practiced in network computing environments with many types of computer system configurations, including, an in-dash vehicle computer, personal computers, desktop computers, laptop computers, message processors, handheld devices, multi-processor systems, microprocessor-based or programmable consumer electronics, network PCs, minicomputers, mainframe computers, mobile telephones, PDAs, tablets, pagers, routers, switches, various storage devices, and the like. The disclosure may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Further, where appropriate, functions described herein can be performed in one or more of: hardware, software, firmware, digital components, or analog components. For example, one or more application specific integrated circuits (ASICs) can be programmed to carry out one or more of the systems and procedures described herein. Certain terms are used throughout the description and claims to refer to particular system components. As one skilled in the art will appreciate, components may be referred to by different names. This document does not intend to distinguish between components that differ in name, but not function.

It should be noted that the sensor embodiments discussed above may comprise computer hardware, software, firmware, or any combination thereof to perform at least a portion of their functions. For example, a sensor may include computer code configured to be executed in one or more processors, and may include hardware logic/electrical circuitry controlled by the computer code. These example devices are provided herein purposes of illustration, and are not intended to be limiting. Embodiments of the present disclosure may be implemented in further types of devices, as would be known to persons skilled in the relevant art(s).

At least some embodiments of the disclosure have been directed to computer program products comprising such logic (e.g., in the form of software) stored on any computer useable medium. Such software, when executed in one or more data processing devices, causes a device to operate as described herein.

While various embodiments of the present disclosure have been described above, it should be understood that they have been presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the above-described exemplary embodiments, but should be defined only in accordance with the following claims and their equivalents. The foregoing description has been presented for the purposes of illustration and description. It is not intended to be exhaustive or to limit the disclosure to the precise form disclosed. Many modifications and variations are possible in light of the above teaching. Further, it should be noted that any or all of the aforementioned alternate implementations may be used in any combination desired to form additional hybrid implementations of the disclosure.

The invention claimed is:

1. A method for storing data comprising:
receiving, by a storage node a first write request including first payload data and first address data;
encoding, by the storage node, the first payload data according to one or more first encoding protocols to obtain first encoded data;
writing, by the storage node, the first encoded data to a first segment of a storage device at a first offset;
writing, by the storage node, the first offset, the first address data, and one or more first tags identifying the one or more first encoding protocols as a first metadata entry in an index portion of the first segment;
wherein writing the first payload data of the first write request to the first segment comprises:
writing, by the storage node, the first payload data at a first open position from a first end of the first segment; and
writing, by the storage node, the first metadata entry to the first segment at an open position in an un-filled metadata index closest to a second end of the first segment opposite the first end.

2. The method of claim 1, wherein the one or more first encoding protocols include an encryption protocol.

3. The method of claim 1, wherein the one or more first encoding protocols include a compression protocol.

4. The method of claim 1, further comprising:
receiving, by the storage node, an instruction to implement one or more second encoding protocols;
receiving, by the storage node a second write include including second payload data and second address data;
encoding, by the storage node, the second payload data according to one or more second encoding protocols to obtain second encoded data;
writing, by the storage node, the second encoded data to a second offset in a second segment of the storage device; and
writing, by the storage node, the second offset, the second address data, and one or more second tags identifying the one or more second encoding protocols as a second metadata entry in an index portion of the second segment.

5. The method of claim 1, further comprising:
receiving, by the storage node, a first read TOP including the first address data;
retrieving, by the storage node, the first metadata entry;
retrieving, by the storage node, the first encoded data from the first segment according to the first offset of the first metadata entry;
(a) identifying, by the storage node, the one or more first encoding protocols according to the one or more first tags in the first metadata entry;
in response to (a), decoding, by the storage node, the first encoded data using the one or more first encoding protocols to obtain the first payload data; and
returning, by the storage node, the first payload data to a source of the first read TOP.

6. The method of claim 5, wherein the source of the first read TOP is a remote compute node.

7. A method for storing data comprising:
receiving, by a storage node a first write request including first payload data and first address data;
encoding, by the storage node, the first payload data according to one or more first encoding protocols to obtain first encoded data;
writing, by the storage node, the first encoded data to a first segment of a storage device at a first offset;
writing, by the storage node, the first offset, the first address data, and one or more first tags identifying the one or more first encoding protocols as a first metadata entry in an index portion of the first segment;
defining, by the storage node, a segment map having a plurality of segment entries, each segment entry corresponding to a segment of a plurality of segments available for storage on the storage device, the plurality of segments including the first segment;
processing, by the storage node, a plurality of write requests, each write request referencing a storage volume and including payload data and a write address, the plurality of write requests including the first write request;
determining, by the storage node, that, for the first write request, that (a) an entry in the segment map references the storage volume of the first write request and corresponds to the first segment, the first segment having sufficient space for the first payload data of the first write request;
in response to determining (a), writing, by the storage node, the first payload data of the first write request to the first segment;

determining, by the storage node, that, for a second write request of the plurality of write requests, that (b) no entry in the segment map both references the storage volume of the second write request and corresponds to any segment having sufficient space for the payload data of the second write request; and in response to determining (b)—

(i) selecting an unassigned segment from the plurality of segments;

(ii) adding a reference to the storage volume of the second write request to a segment entry of the segment map corresponding to the unassigned segment of the plurality of segments; and (iii) writing the payload data of the second write request to the unassigned segment.

8. The method of claim 7, further comprising:

defining, by the storage node, a slice map including a plurality of slice entries, each slice entry having a corresponding slice identifier and representing a portion of the storage device;

obtaining, by the storage node, for the second write request, a slice address from the second write request;

determining, by the storage node, that no entry in the slice map corresponds to the slice address;

in response to determining that no entry in the slice map corresponds to the offset— writing, by the storage node, the slice address to a slice entry of the plurality of slice entries;

wherein adding the reference to the storage volume of the second write request to the segment entry of the segment map corresponding to the unassigned segment of the plurality of segments comprises adding, by the storage node, a slice identifier corresponding to the slice entry if the plurality of slice entries to which the slice address was written to the segment entry of the segment map corresponding to the unassigned segment.

9. The method of claim 8, further comprising:

storing, by a storage manager computing device that is remote from the storage node, a volume map, the volume map including a volume entry mapping the slice address from the second write request to the storage node.

10. A system comprising a plurality of storage nodes, each storage node being programmed to:

receive a first write request including first payload data and first address data;

encode the first payload data according to one or more first encoding protocols to obtain first encoded data;

write the first encoded data to a first segment of a storage device at a first offset; and write the first offset, the first address data, and one or more first tags identifying the one or more first encoding protocols as a first metadata entry in an index portion of the first segment wherein each storage node is further programmed to:

write the first payload data of the first write request to the first segment by:

writing the first payload data at a first open position from a first end of the first segment and write the first metadata entry to the first segment at an open position in an un-filled metadata index closest to a second end of the first segment opposite the first end.

11. The system of claim 10, wherein the one or more first encoding protocols include an encryption protocol.

12. The system of claim 10, wherein the one or more first encoding protocols include a compression protocol.

13. The system of claim 10, wherein each storage node is further programmed to:

receive an instruction to implement one or more second encoding protocols;

receive a second write include including second payload data and second address data;

encode the second payload data according to one or more second encoding protocols to obtain second encoded data;

write the second encoded data to a second offset in a second segment of the storage device; and write the second offset, the second address data, and one or more second tags identifying the one or more second encoding protocols as a second metadata entry in an index portion of the second segment.

14. The system of claim 10, wherein each storage node is further programmed to:

receive a first read TOP including the first address data;

retrieve the first metadata entry;

retrieve the first encoded data from the first segment according to the first offset of the first metadata entry;

(a) identify the one or more first encoding protocols according to the one or more first tags in the first metadata entry;

in response to (a), decode the first encoded data using the one or more first encoding protocols to obtain the first payload data; and return the first payload data to a source of the first read TOP.

15. The system of claim 14, further comprising a remote computing node, the remote computing node being the source of the first read TOP is a remote compute node.

16. A system comprising a plurality of storage nodes, each storage node being programmed to:

receive a first write request including first payload data and first address data;

encode the first payload data according to one or more first encoding protocols to obtain first encoded data;

write the first encoded data to a first segment of a storage device at a first offset write the first offset, the first address data, and one or more first tags identifying the one or more first encoding protocols as a first metadata entry in an index portion of the first segment define a segment map having a plurality of segment entries, each segment entry corresponding to a segment of a plurality of segments available for storage on the storage device, the plurality of segments including the first segment;

process a plurality of write requests, each write request referencing a storage volume and including payload data and a write address, the plurality of write requests including the first write request;

determine that, for the first write request, that (a) an entry in the segment map references the storage volume of the first write request and corresponds to the first segment, the first segment having sufficient space for the first payload data of the first write request;

in response to determining (a), write the first payload data of the first write request to the first segment; and determine that, for a second write request of the plurality of write requests, that (b) no entry in the segment map both references the storage volume of the second write request and corresponds to any segment having sufficient space for the payload data of the second write request;

in response to determining (b)—
(i) select an unassigned segment from the plurality of segments;
(ii) add a reference to the storage volume of the second write request to a segment entry of the segment map corresponding to the unassigned segment of the plurality of segments; and
(iii) write the payload data of the second write request to the unassigned segment.

17. The system of claim 16, wherein each storage node is further programmed to:
define a slice map including a plurality of slice entries, each slice entry having a corresponding slice identifier and representing a portion of the storage device;
obtain, for the second write request, a slice address from the second write request;
determine that no entry in the slice map corresponds to the slice address;
in response to determining that no entry in the slice map corresponds to the offset—
writing the slice address to a slice entry of the plurality of slice entries;
wherein adding the reference to the storage volume of the second write request to the segment entry of the segment map corresponding to the unassigned segment of the plurality of segments comprises adding a slice identifier corresponding to the slice entry if the plurality of slice entries to which the slice address was written to the segment entry of the segment map corresponding to the unassigned segment.

18. The system of claim 17, further comprising a storage manager computing device remote from the plurality of storage nodes, the storage manager computing device being programmed to:
store a volume map, the volume map including a volume entry mapping the slice address from the second write request to the each storage node.

* * * * *